US012185567B2

(12) United States Patent
Choi et al.

(10) Patent No.: US 12,185,567 B2
(45) Date of Patent: Dec. 31, 2024

(54) FLEXIBLE DISPLAY DEVICE INCLUDING PROTRUDING ADHESIVE LAYER

(71) Applicant: LG DISPLAY CO., LTD., Seoul (KR)

(72) Inventors: Kou Choi, Daegu (KR); HyunChul Kim, Gumi-si (KR); Kyoung-Hoon Kim, Gumi-si (KR); Kwangju Lee, Gumi-si (KR); TaeWoo Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/952,423

(22) Filed: Sep. 26, 2022

(65) Prior Publication Data

US 2023/0008564 A1  Jan. 12, 2023

Related U.S. Application Data

(63) Continuation of application No. 17/037,631, filed on Sep. 29, 2020, now Pat. No. 11,489,141.

(30) Foreign Application Priority Data

Oct. 25, 2019 (KR) ........................ 10-2019-0133496

(51) Int. Cl.
*H10K 50/84* (2023.01)
*H10K 50/844* (2023.01)
(Continued)

(52) U.S. Cl.
CPC ......... *H10K 50/844* (2023.02); *H10K 59/131* (2023.02); *H10K 77/111* (2023.02);
(Continued)

(58) Field of Classification Search
CPC .... H10K 50/844; H10K 50/86; H10K 50/868; H10K 50/8426; H10K 50/84;
(Continued)

(56) References Cited

U.S. PATENT DOCUMENTS 7,764,333 B2 * 7/2010 Kim .................... G02B 6/0086
349/58
9,276,055 B1 * 3/2016 Son ........................ H10K 50/86
(Continued)

FOREIGN PATENT DOCUMENTS

CN 103971602 A 8/2014
CN 108932076 A 12/2018
(Continued)

OTHER PUBLICATIONS

Korean Office Action dated Jul. 17, 2024 issued in Patent Application No. 10-2019-0133496 w/English Translation (11 pages).

*Primary Examiner* — Ida M Soward
(74) *Attorney, Agent, or Firm* — POLSINELLI PC

(57) ABSTRACT

A flexible display device includes a polarizing plate disposed on a display panel, an adhesive layer disposed on the polarizing plate; a cover window having a curved edge and disposed on the polarizing plate; a light blocking pattern disposed between the adhesive layer and the cover window; and a back plate disposed on a rear surface of the display panel, wherein the curved edge of the cover window protrudes more than the light blocking pattern and a corner of the display panel, thereby improving product quality by improving waterproof performance and minimizing chemical contamination.

22 Claims, 16 Drawing Sheets

(51) Int. Cl.
  *H10K 59/13*     (2023.01)
  *H10K 59/131*    (2023.01)
  *H10K 77/10*     (2023.01)
  *G02F 1/1333*    (2006.01)
  *G02F 1/1335*    (2006.01)
  *H10K 50/80*     (2023.01)
  *H10K 50/86*     (2023.01)
  *H10K 59/126*    (2023.01)
  *H10K 102/00*    (2023.01)

(52) U.S. Cl.
  CPC .. *G02F 1/133305* (2013.01); *G02F 1/133331* (2021.01); *G02F 1/133528* (2013.01); *H10K 50/86* (2023.02); *H10K 50/868* (2023.02); *H10K 59/126* (2023.02); *H10K 2102/00* (2023.02)

(58) Field of Classification Search
  CPC .... H10K 59/131; H10K 59/126; H10K 59/12; H10K 77/111; H10K 2102/00; G02F 1/133331; G02F 1/133305
  See application file for complete search history.

(56) References Cited

U.S. PATENT DOCUMENTS

| | | | | |
|---|---|---|---|---|
| 10,274,658 B2* | 4/2019 | Kim | .................... | G06F 1/1658 |
| 10,721,825 B2 | 7/2020 | Hassemer et al. | | |
| 10,892,441 B2 | 1/2021 | Jung et al. | | |
| 11,011,727 B2* | 5/2021 | Jin | .................... | H10K 71/00 |
| 11,171,184 B2 | 11/2021 | Lee et al. | | |
| 2009/0066862 A1* | 3/2009 | Ishii | .................. | G02F 1/133308 349/12 |
| 2009/0257010 A1* | 10/2009 | Sakurai | .............. | G02F 1/133308 349/110 |
| 2010/0157218 A1* | 6/2010 | Ishii | .................. | G02F 1/133308 349/122 |
| 2010/0231821 A1* | 9/2010 | Tsuji | .................. | G02F 1/133308 361/679.01 |
| 2010/0245707 A1* | 9/2010 | Harada | .............. | G02F 1/133308 349/122 |
| 2012/0075838 A1* | 3/2012 | Lee | ................... | G02F 1/133308 359/601 |
| 2012/0200796 A1* | 8/2012 | Harayama | ......... | G02F 1/133308 349/43 |
| 2012/0200805 A1* | 8/2012 | Harayama | ......... | G02F 1/133308 349/62 |
| 2012/0212928 A1* | 8/2012 | Lee | ...................... | G02F 1/1333 362/97.4 |
| 2013/0300975 A1* | 11/2013 | Suzuki | .............. | G02F 1/133308 362/19 |
| 2014/0307396 A1 | 10/2014 | Lee | | |
| 2014/0335316 A1* | 11/2014 | Fukushima | ............... | B32B 7/12 428/161 |
| 2015/0103053 A1 | 4/2015 | Lin et al. | | |
| 2015/0115297 A1* | 4/2015 | Lee | ........................ | H10K 59/40 257/89 |
| 2015/0220191 A1* | 8/2015 | Huh | ....................... | G06F 3/0443 345/173 |
| 2016/0064466 A1 | 3/2016 | Son et al. | | |
| 2016/0139706 A1* | 5/2016 | Lee | ....................... | G06F 3/0446 345/174 |
| 2016/0139728 A1* | 5/2016 | Jeon | ..................... | G06F 3/0448 345/173 |
| 2016/0218312 A1* | 7/2016 | Chang | ................ | H10K 50/8426 |
| 2016/0239132 A1* | 8/2016 | Lee | .................. | G02F 1/133305 |
| 2016/0275830 A1 | 9/2016 | You et al. | | |
| 2017/0038515 A1 | 2/2017 | Yuki et al. | | |
| 2017/0047547 A1 | 2/2017 | Son et al. | | |
| 2017/0090637 A1 | 3/2017 | Yoon et al. | | |
| 2017/0160581 A1* | 6/2017 | Matsuoka | ......... | G02F 1/133308 |
| 2017/0177128 A1* | 6/2017 | Son | ..................... | G06F 3/04164 |
| 2017/0279074 A1* | 9/2017 | Ma | .......................... | B32B 27/06 |
| 2017/0307923 A1* | 10/2017 | Hwang | ............... | G02F 1/13338 |
| 2017/0324060 A1* | 11/2017 | Kim | ....................... | H10K 50/844 |
| 2017/0343852 A1* | 11/2017 | Park | ....................... | H10K 59/40 |
| 2018/0007789 A1 | 1/2018 | Kawata et al. | | |
| 2018/0034130 A1* | 2/2018 | Jang | ........................ | H10K 59/00 |
| 2018/0151641 A1 | 5/2018 | Choo et al. | | |
| 2018/0198089 A1* | 7/2018 | Kim | ....................... | H10K 50/844 |
| 2018/0246365 A1 | 8/2018 | Choi et al. | | |
| 2019/0035869 A1* | 1/2019 | Kim | ....................... | H10K 50/844 |
| 2019/0064586 A1 | 2/2019 | Zhang et al. | | |
| 2019/0072997 A1 | 3/2019 | Cha et al. | | |
| 2019/0080140 A1 | 3/2019 | Lee et al. | | |
| 2019/0129232 A1* | 5/2019 | Itagaki | ............. | G02F 1/133512 |
| 2019/0177459 A1* | 6/2019 | Kim | ......................... | B32B 9/002 |
| 2019/0196265 A1* | 6/2019 | Fujihara | ............ | G02F 1/13338 |
| 2019/0198801 A1 | 6/2019 | Kuon et al. | | |
| 2019/0219861 A1* | 7/2019 | Sawasaki | ............ | G02F 1/13363 |
| 2019/0227212 A1* | 7/2019 | Kim | ....................... | G06F 1/1684 |
| 2019/0285940 A1* | 9/2019 | Yonemura | ........... | G09G 3/2022 |
| 2020/0021016 A1 | 1/2020 | Son et al. | | |
| 2020/0136066 A1 | 4/2020 | Jin | | |
| 2020/0136069 A1 | 4/2020 | Paek et al. | | |
| 2020/0137890 A1 | 4/2020 | Lee et al. | | |
| 2020/0142242 A1 | 5/2020 | Kikuchi et al. | | |
| 2020/0203641 A1* | 6/2020 | Lee | .................... | G02F 1/136286 |
| 2021/0336161 A1 | 10/2021 | Xiang | | |
| 2021/0356794 A1 | 11/2021 | Yu et al. | | |

FOREIGN PATENT DOCUMENTS

| | | |
|---|---|---|
| KR | 10-2017-0050707 A | 5/2017 |
| WO | 2014115697 A1 | 7/2014 |

* cited by examiner

FLEXIBLE DISPLAY DEVICE INCLUDING PROTRUDING ADHESIVE LAYER

CROSS-REFERENCE TO RELATED APPLICATIONS

This application is a continuation of U.S. patent application Ser. No. 17/037,631, filed on Sep. 29, 2020, which claims the priority of Korean Patent Application No. 10-2019-0133496 filed on Oct. 25, 2019, which are hereby incorporated by reference in their entirety for all purposes as if fully set forth herein.

BACKGROUND

Field of the Disclosure

The present disclosure relates to a flexible display device and more particularly, to a flexible display device allowing for a reduction in a width of a bezel.

Description of the Background

Recently, as society advances toward an information-oriented society, the field of display devices for visually expressing electrical information signals has rapidly advanced. Various display devices, having excellent performance in terms of thinness, weight reduction, and low power consumption, are being developed correspondingly.

Representative display devices may include a liquid crystal display device (LCD), a field emission display device (FED), an electro-wetting display device (EWD), an organic light emitting display device (OLED), and the like.

An electroluminescent display device represented by an organic light emitting display device is a self-light emitting display device, and may be manufactured to be light and thin since it does not require a separate light source, unlike a liquid crystal display device having a separate light source. In addition, the electroluminescent display device has advantages in terms of power consumption due to a low voltage driving, and is excellent in terms of a color implementation, a response speed, a viewing angle, and a contrast ratio (CR). Therefore, electroluminescent display devices are expected to be utilized in various fields.

In the electroluminescent display device, an emissive layer (EML) is disposed between two electrodes formed of an anode and a cathode. When holes from the anode are injected into the emissive layer and electrons from the cathode are injected into the emissive layer, the injected electrons and holes recombine with each other to form excitons in the emissive layer and emit light.

A host material and a dopant material are included in the emissive layer and interact with each other. A host generates excitons from the electrons and holes and transfers energy to a dopant. The dopant is a dye-based organic material that is added in a small amount, and receives the energy from the host to convert it into light.

The electroluminescent display device is encapsulated with glass, metal, or film to block the introduction of moisture or oxygen from the outside to the interior of the electroluminescent display device, thereby preventing oxidation of the emissive layer or the electrode and protecting it from external mechanical or physical impacts.

SUMMARY

As display devices are miniaturized, efforts aimed at reducing a bezel area which is an outer circumferential portion of a display area, in order to increase a size of an effective display screen in the same area of the display device, are continuing.

However, since lines and a driving circuit for driving the screen are disposed in the bezel area corresponding to a non-display area, there is a limitation in reducing the bezel area.

With regard to a flexible electroluminescent display device capable of maintaining a display performance even when bent, by applying a flexible substrate formed of a flexible material such as plastic, there is an effort to reduce a bezel area by bending a non-display area of the flexible substrate, while securing an area for lines and a driving circuit.

Electroluminescent display devices using a flexible substrate such as plastic or the like need to secure flexibility of various insulating layers disposed on the substrate and lines formed of a metal material and to prevent defects such as cracks that may be caused by bending.

A protective layer such as a micro-coating layer is disposed over the insulating layers and lines in a bending area to prevent the occurrence of cracks and protect the lines from an external foreign material. The protective layer may be coated to have a predetermined thickness and serve to adjust a neutral plane of the bending area.

In the recent electroluminescent display devices for minimizing the bezel area and allowing for a reduction in thickness of the display device, a bending area of a flexible substrate has an extreme curvature and a thickness of the micro-coating layer is minimized.

Meanwhile, a fixing tape is attached to four sides of a flexible display device so as to implement a waterproofing function of the display device. However, even with a cross-attachment of the fixing tape, gaps are generated at corners of the display device, thereby causing vulnerability to contamination in chemical resistance evaluation according to exposure of a polarizing plate.

Accordingly, the present disclosure is to solve the aforementioned problems and to provide a flexible display device that improves a waterproof performance and prevents chemical contamination.

The present disclosure is not limited to the above-mentioned objects, and other objects, which are not mentioned above, can be clearly understood by those skilled in the art from the following descriptions.

According to an aspect of the present disclosure, a flexible display device may include a polarizing plate disposed on a display panel; a cover glass attached to the polarizing plate with an adhesive layer interposed therebetween; a back plate disposed on a rear surface of the display panel; and a fixing tape disposed on an edge of a rear surface of the cover glass, wherein the adhesive layer protrudes more than the display panel, the polarizing plate, and the back plate at corner regions of the flexible display device.

According to another aspect of the present disclosure, a flexible display device may include a polarizing plate disposed on a display panel; a cover glass attached to the polarizing plate with an adhesive layer interposed therebetween; a back plate disposed on a rear surface of the display panel; a cushion tape disposed on a rear surface of the back plate; a light blocking pattern provided on an edge of a rear surface of the cover glass; and a fixing tape attached to a rear surface of the light blocking pattern in an upper side and a lower side of the flexible display device, and attached to a rear surface of the cushion tape in a left side and a right side of the flexible display device, wherein the adhesive layer protrudes more than the display panel, the polarizing plate, and the back plate at corner regions of the flexible display device.

Other detailed matters of the exemplary aspects are included in the detailed description and the drawings.

A flexible display device according to an exemplary aspect of the present disclosure may provide effects of improving an aesthetic sense by reducing a width of a bezel.

A flexible display device according to another exemplary aspect of the present disclosure may provide effects of improving product quality by improving a waterproof performance and minimizing chemical contamination.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
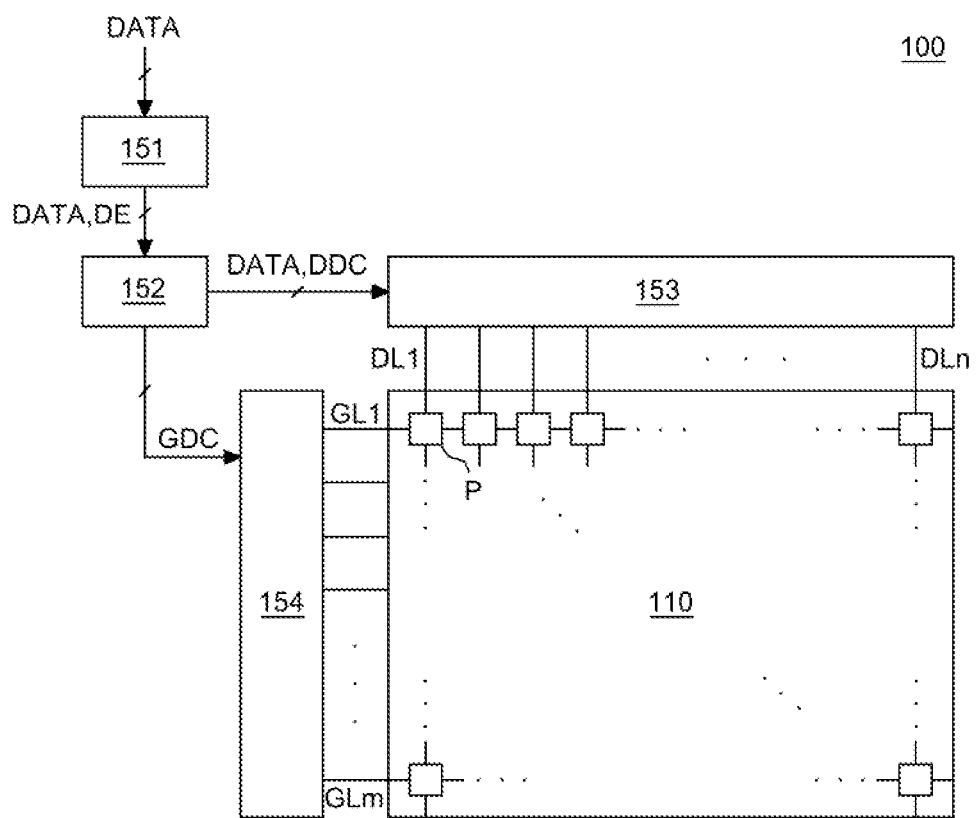
FIG. 1 is a block diagram of a flexible display device according to an exemplary aspect of the present disclosure.

Advantages and characteristics of the present disclosure and a method of achieving the advantages and characteristics will be clear by referring to exemplary aspects described below in detail together with the accompanying drawings. However, the present disclosure is not limited to the exemplary aspects disclosed herein but will be implemented in various forms. The exemplary aspects are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various aspects of the present disclosure can be partially or entirely adhered to or combined with each other and can be interlocked and operated in technically various ways, and the aspects can be carried out independently of or in association with each other.

Hereinafter, a flexible display device according to exemplary aspects of the present disclosure will be described in detail with reference to accompanying drawings.

FIG. 1 is a block diagram of a flexible display device according to an exemplary aspect of the present disclosure.

With reference to FIG. 1, a flexible display device 100 according to an exemplary aspect of the present disclosure may include an image processing unit 151, a timing controller 152, a data driver 153, a gate driver 154, and a display panel 110.

The image processing unit 151 may output a data signal DATA and a data enable signal DE that are supplied from the outside. The image processing unit 151 may output one or more of a vertical synchronization signal, a horizontal synchronization signal, and a clock signal, in addition to the data enable signal DE.

The timing controller 152 is supplied with the data enable signal DE or the data signal DATA, together with driving signals including the vertical synchronization signal, the horizontal synchronization signal, the clock signal and the like, from the image processing unit 151. The timing controller 152 may output a gate timing control signal GDC for controlling an operational timing of the gate driver 154 and a data timing control signal DDC for controlling an operational timing of the data driver 153 based on the driving signals.

The data driver 153 samples and latches the data signal DATA supplied from the timing controller 152 in response to the data timing control signal DDC supplied from the timing controller 152, and converts the data signal DATA into a gamma reference voltage to output it. The data driver 153 may output the data signal DATA through data lines DL1 to DLn.

The gate driver 154 may output a gate signal while shifting a level of a gate voltage in response to the gate timing control signal GDC supplied from the timing controller 152. The gate driver 154 may output the gate signal through gate lines GL1 to GLm.

The display panel 110 may display an image while sub-pixels P emit light in response to the data signal DATA and the gate signal supplied from the data driver 153 and the gate driver 154. A detailed structure of the sub-pixel P will be described in detail in FIG. 2 and FIGS. 4A and 4B.

Figure 2:
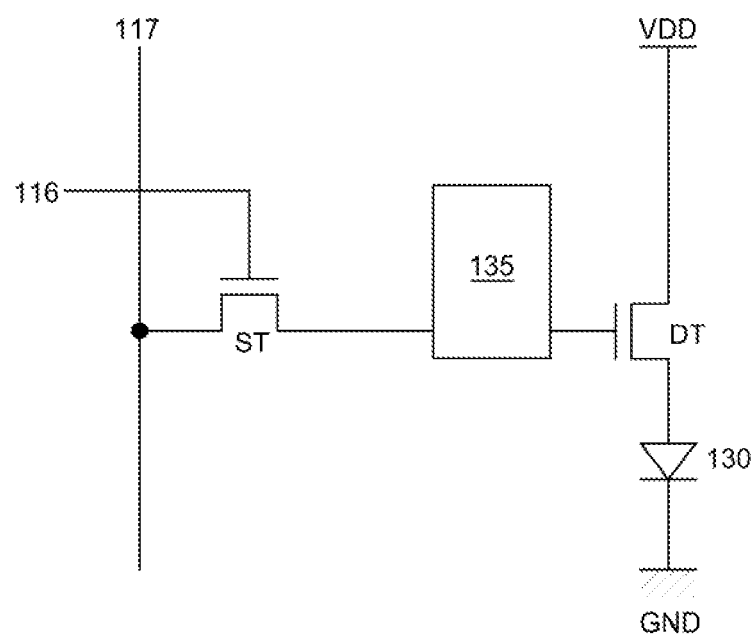
FIG. 2 is a circuit diagram of a sub-pixel included in the flexible display device according to an exemplary aspect of the present disclosure.

FIG. 2 is a circuit diagram of a sub-pixel included in the flexible display device according to an exemplary aspect of the present disclosure.

With reference to FIG. 2, the sub-pixel of the flexible display device according to an exemplary aspect of the present disclosure may include a switching transistor ST, a driving transistor DT, a compensation circuit 135, and a light emitting element 130.

The light emitting element 130 may operate to emit light according to a driving current formed by the driving transistor DT.

The switching transistor ST may perform a switching operation such that a data signal supplied through a data line 117 is stored as a data voltage in a capacitor, in response to a gate signal supplied through a gate line 116.

The driving transistor DT may operate such that a constant driving current flows between a high potential power line VDD and a low potential power line GND in response to the data voltage stored in the capacitor.

The compensation circuit 135 is a circuit for compensating for a threshold voltage or the like of the driving transistor DT, and the compensation circuit 135 may include one or more thin film transistors and capacitors. A configuration of the compensation circuit 135 may vary according to a compensation method.

For example, the sub-pixel shown in FIG. 2 is configured to have a structure of 2T (Transistor) 1C (Capacitor) including a switching transistor ST, a driving transistor DT, a capacitor, and a light emitting element 130. However, the sub-pixel may be configured to have a variety of structures, such as 3T1C, 4T2C, 5T2C, 6T1C, 6T2C, 7T1C, 7T2C, and the like when the compensation circuit 135 is added thereto.

Figure 3:
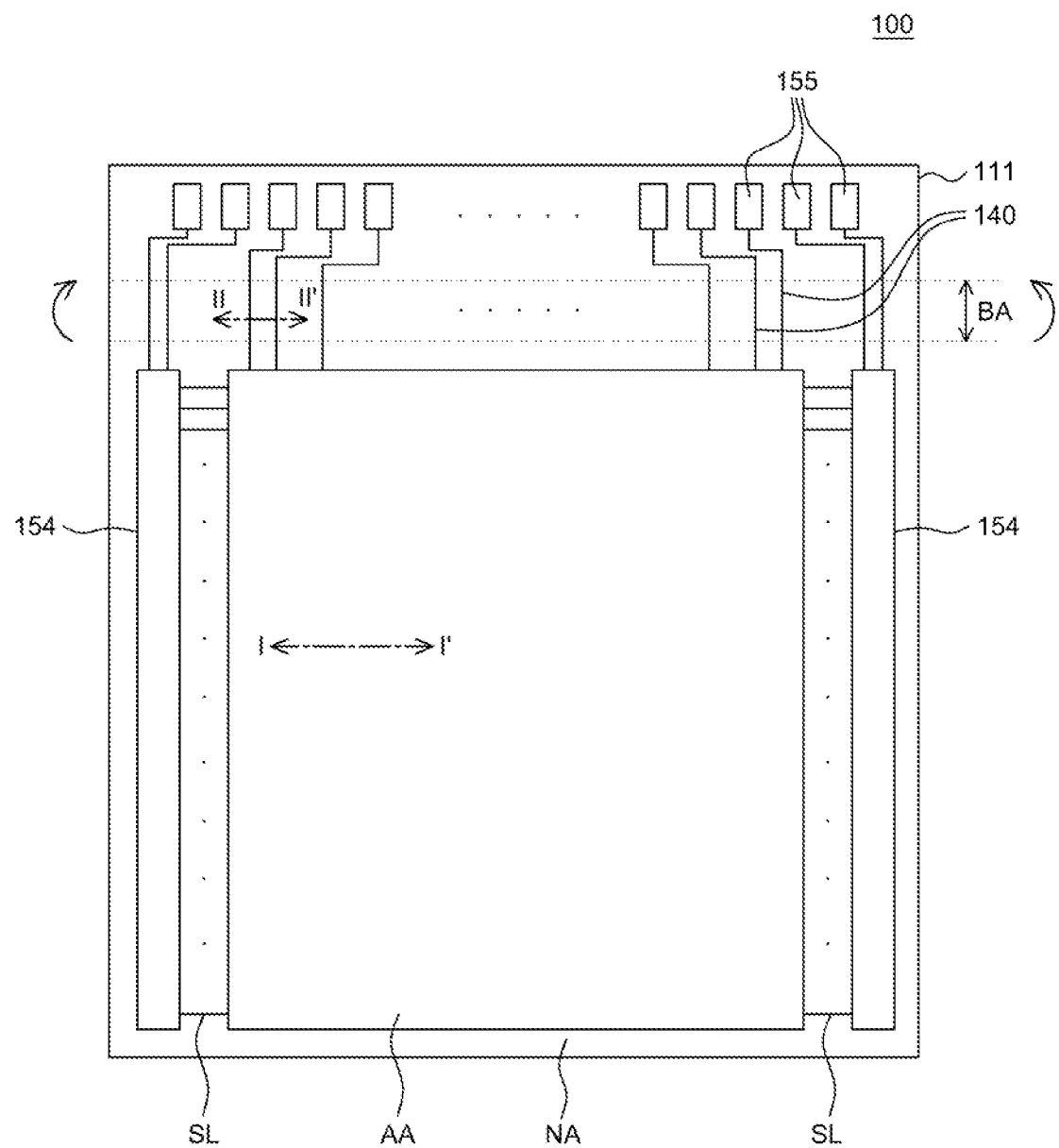
FIG. 3 is a plan view of the flexible display device according to an exemplary aspect of the present disclosure.

FIG. 3 is a plan view of the flexible display device according to an exemplary aspect of the present disclosure.

FIG. 3 illustrates, for example, a state in which a flexible substrate 111 of the flexible display device 100 according to an exemplary aspect of the present disclosure is not bent.

With reference to FIG. 3, the flexible display device 100 may include a display area AA where pixels actually emitting light through a thin film transistor and a light emitting element on the flexible substrate 111 are disposed, and a non-display area NA, which is a bezel area surrounding edges of the display area AA.

A circuit such as a gate driver 154 for driving the flexible display device 100 and various signal lines such as a scan line (SL) and the like may be disposed in the non-display area NA of the flexible substrate 111.

The circuit for driving the flexible display device 100 may be disposed on the flexible substrate 111 in a gate in panel (GIP) manner, or may be connected to the flexible substrate 111 in a tape carrier package (TCP) or chip on film (COF) manner.

A pad 155 that is a metal pattern is disposed on one side of the flexible substrate 111 in the non-display area NA, so that an external module may be bonded thereto.

A bending area BA may be formed by bending a portion of the non-display area NA of the flexible substrate 111 in a bending direction as indicated by an arrow.

The non-display area NA of the flexible substrate 111 is an area where lines and driving circuits for driving a screen are disposed. Since the non-display area NA is not an area where an image is displayed, it is unnecessary to be viewed from an upper surface of the flexible substrate 111. Thus, by bending a portion of the non-display area NA of the flexible substrate 111, the bezel area BA may be reduced, while securing an area for the lines and driving circuits.

Various lines may be formed on the flexible substrate 111. The lines may be formed in the display area AA of the flexible substrate 111, or circuit lines 140 formed in the non-display area NA may connect the driving circuits or the gate driver, the data driver, and the like to each other to transfer signals.

The circuit lines 140 are formed of a conductive material, and may be formed of a conductive material having excellent ductility in order to reduce the occurrence of cracks when the flexible substrate 111 is bent. The circuit lines 140 may be formed of a conductive material having excellent ductility such as gold (Au), silver (Ag), or aluminum (Al), or may be formed of one of various conductive materials used in the display area AA. The circuit lines 140 may also be formed of one of molybdenum (Mo), chromium (Cr), titanium (Ti), nickel (Ni), neodymium (Nd), copper (Cu), and alloys of silver (Ag) and magnesium (Mg).

The circuit lines 140 may be formed of a multilayer structure including various conductive materials, and may be formed of a three-layer structure of titanium (Ti)/aluminum (Al)/titanium (Ti), but aspects are not limited thereto.

The circuit lines 140 formed in the bending area BA are subjected to tensile force when bent. The circuit lines 140 extending in the same direction as the bending direction on the flexible substrate 111 are subjected to the greatest tensile force, so that cracks or disconnection may occur therein. Therefore, rather than forming the circuit lines 140 to extend in the bending direction, at least a portion of the circuit lines 140 disposed in an area including the bending area BA is formed to extend in a diagonal direction, which is a direction different from the bending direction, so that the tensile force may be minimized.

The circuit line 140 disposed in an area including the bending area BA may be variously shaped, and may be formed in a shape such as a trapezoidal wave shape, a triangular wave shape, a sawtooth wave shape, a sinusoidal wave shape, an omega (Ω) shape, a rhombus shape, or the like.

Figure 4A:
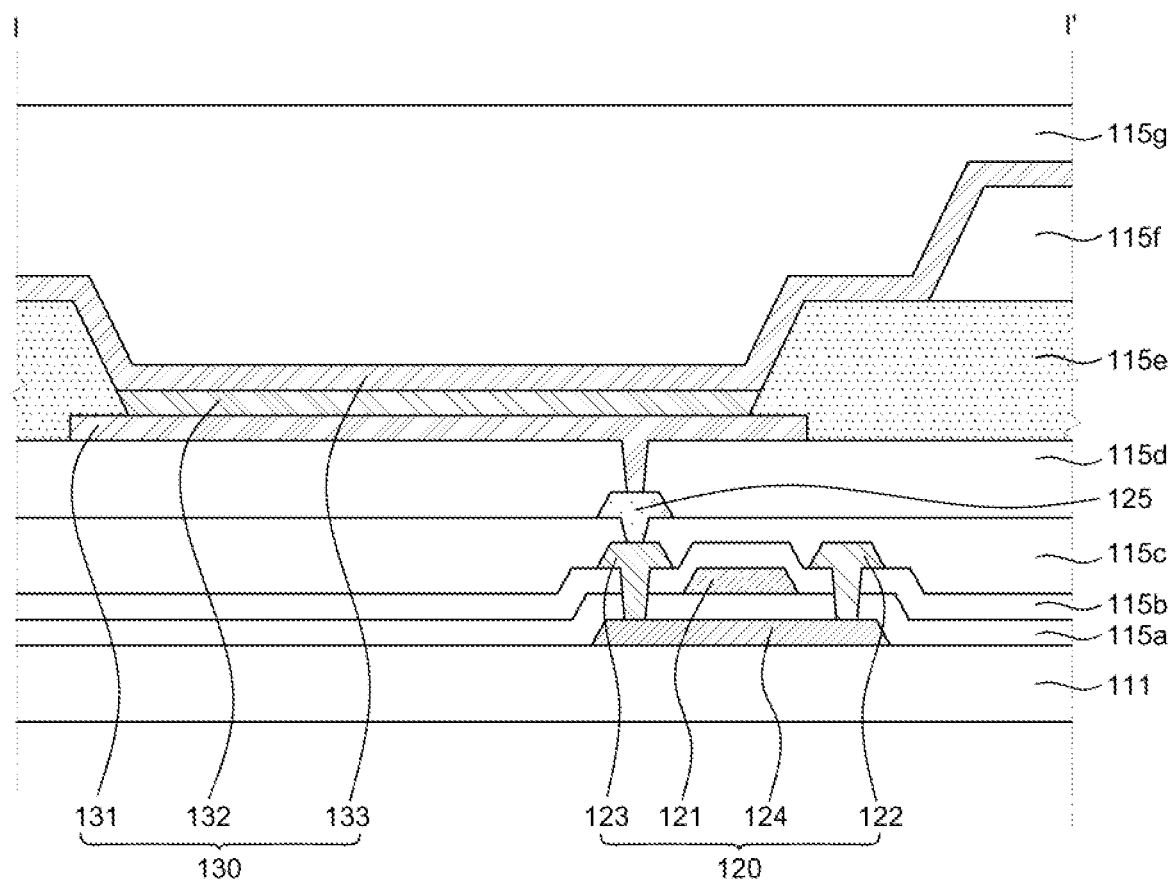
FIG. 4A is a cross-sectional view taken along line I-I' of FIG. 3.

FIG. 4A is a cross-sectional view taken along line I-I' of FIG. 3.

Figure 4B:
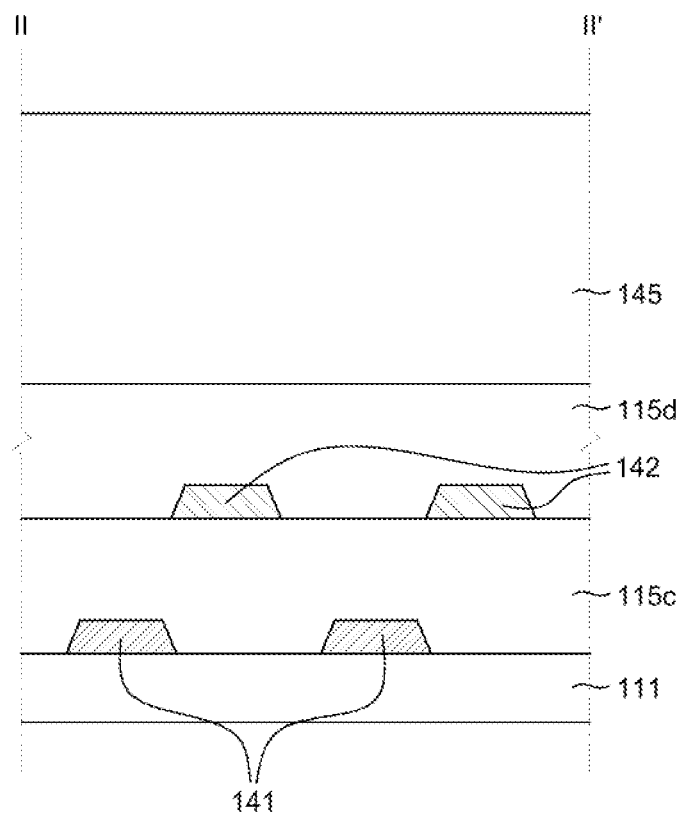
FIG. 4B is a cross-sectional view taken along line II-II' of FIG. 3.

FIG. 4B is a cross-sectional view taken along line II-II' of FIG. 3.

FIG. 4A illustrates a structural cross-section I-I' of the display area AA described in FIG. 3.

With reference to FIG. 4A, the flexible substrate 111 serves to support and protect components of the flexible display device 100 disposed thereon.

Recently, the flexible substrate 111 may be formed of a ductile material having flexible characteristics such as plastic.

The flexible substrate 111 may be in a form of film including one of a polyester-based polymer, a silicone-based polymer, an acrylic-based polymer, a polyolefin-based polymer, and a copolymer thereof.

For example, the flexible substrate 111 may be formed of at least one of polyethylene terephthalate (PET), polybutylene terephthalate (PBT), polysilane, polysiloxane, polysilazane, polycarbosilane, polyacrylate, polymethacrylate, polymethylacrylate, polymethylmetacrylate, polyethylacrylate, polyethylmethacrylate, a cyclic olefin copolymer (COC), a cyclic olefin polymer (COP), polyethylene (PE), polypropylene (PP), polyimide (PI), polymethylmethacrylate (PMMA), polystyrene (PS), polyacetal (POM), polyether ether ketone (PEEK), polyestersulfone (PES), polytetrafluoroethylene (PTFE), polyvinylchloride (PVC), polycarbonate (PC), polyvinylidenefluoride (PVDF), a perfluoroalkyl polymer (PFA), a styrene acrylonitrile copolymer (SAN), and combinations thereof.

A buffer layer may be further disposed on the flexible substrate 111. The buffer layer prevents penetration of moisture or other impurities from the outside through the flexible substrate 111 and may planarize a surface of the flexible substrate 111. The buffer layer is not necessarily a necessary component, and may be deleted depending on a type of a thin film transistor 120 disposed on the flexible substrate 111.

The thin film transistor 120 is disposed on the flexible substrate 111 and may include a gate electrode 121, a source electrode 122, a drain electrode 123 and a semiconductor layer 124.

In this case, the semiconductor layer 124 may be composed of amorphous silicon or polycrystalline silicon, but is not limited thereto. Polycrystalline silicon has superior mobility than amorphous silicon and low energy power consumption and excellent reliability, and thus, may be applied to a driving thin film transistor within the pixel.

The semiconductor layer 124 may be formed of an oxide semiconductor. The oxide semiconductor has excellent mobility and uniformity properties. The oxide semiconductor may be formed of a quaternary metal oxide such as an indium tin gallium zinc oxide (InSnGaZnO)-based material, a ternary metal oxide such as an indium gallium zinc oxide (InGaZnO)-based material, an indium tin zinc oxide (InSnZnO)-based material, an tin gallium zinc oxide (SnGaZnO)-based material, an aluminum gallium zinc oxide (AlGaZnO)-based material, an indium aluminum zinc oxide (InAlZnO)-based material, and a tin aluminum zinc oxide (SnAlZnO)-based material, or a binary metal oxide such as an indium zinc oxide (InZnO)-based material, a tin zinc oxide (SnZnO)-based material, an aluminum zinc oxide (AlZnO)-based material, a zinc magnesium oxide (ZnMgO)-based material, a tin magnesium oxide (SnMgO)-based material, an indium magnesium oxide (InMgO)-based material, an indium gallium oxide (InGaO)-based material, an indium oxide (InO)-based material, a tin oxide (SnO)-based material, and a zinc oxide (ZnO)-based material. Composition ratios of respective elements included in the oxide semiconductor are not limited.

The semiconductor layer 124 may include a source region including a p-type or n-type impurity, a drain region, and a channel region between the source region and the drain region. The semiconductor layer 124 may further include a low concentration doped region between the source region and the drain region adjacent to the channel region.

The source region and the drain region are doped with a high concentration of impurity, and may be connected to the source electrode 122 and the drain electrode 123 of the thin film transistor 120, respectively.

As an impurity ion, the p-type impurity or n-type impurity may be used. The p-type impurity may be one of boron (B), aluminum (Al), gallium (Ga), and indium (In), and the n-type impurity may be one of phosphorus (P), arsenic (As), and antimony (Sb).

The channel region of the semiconductor layer 124 may be doped with the n-type impurity or p-type impurity according to an NMOS or PMOS thin film transistor structure, and the thin film transistor included in the flexible display device 100 according to an exemplary aspect of the present disclosure may be an NMOS or PMOS thin film transistor.

A first insulating layer 115a is an insulating layer composed of a single layer of silicon oxide (SiOx) or silicon nitride (SiNx) or multiple layers thereof, and may be disposed such that a current flowing through the semiconductor layer 124 does not flow to the gate electrode 121. In addition, silicon oxide is less ductile than metal, but is superior in ductility to silicon nitride, and may be formed as a single layer or multiple layers depending on characteristics thereof.

The gate electrode 121 serves as a switch for turning on or turning off the thin film transistor 120 based on an electric signal transmitted from the outside through the gate line, and may be composed of a single layer or multiple layers of a conductive metal such as copper (Cu), aluminum (Al), molybdenum (Mo), chromium (Cr), gold (Au), titanium (Ti), nickel (Ni), and neodymium (Nd), or alloys thereof. However, aspects are not limited thereto.

The source electrode 122 and the drain electrode 123 are connected to the data line, and may enable the electric signal transmitted from the outside to be transmitted from the thin film transistor 120 to the light emitting element 130. The source electrode 122 and the drain electrode 123 may be composed of a single layer or multiple layers of a conductive metal such as copper (Cu), aluminum (Al), molybdenum (Mo), chromium (Cr), gold (Au), titanium (Ti), nickel (Ni), and neodymium (Nd), or alloys thereof, but are not limited thereto.

To insulate the gate electrode 121 and the source electrode 122 and the drain electrode 123 from each other, a second insulating layer 115b composed of a single layer or multiple layers of silicon oxide (SiOx) or silicon nitride (SiNx) may be disposed between the gate electrode 121 and the source electrode 122 and the drain electrode 123.

A passivation layer formed of an inorganic insulating layer such as silicon oxide (SiOx) or silicon nitride (SiNx) may be disposed on the thin film transistor 120.

The passivation layer may prevent unnecessary electrical connections between components disposed over and under the passivation layer and prevent contamination or damage from the outside. The passivation layer may be omitted depending on configurations and characteristics of the thin film transistor 120 and the light emitting element 130.

Structures of the thin film transistor 120 may be divided into an inverted-staggered structure and a coplanar structure according to positions of elements constituting the thin film transistor 120. For example, the thin film transistor having an inverted-staggered structure refers to a thin film transistor having a structure in which a gate electrode is positioned opposite to a source electrode and a drain electrode based on the semiconductor layer. As in FIG. 4A, the thin film transistor 120 having a coplanar structure refers to a thin film transistor having a structure in which the gate electrode 121 is positioned on the same side as the source electrode 122 and the drain electrode 123 based on the semiconductor layer 124.

In FIG. 4A, the thin film transistor 120 having a coplanar structure is illustrated, but the flexible display device 100 according to an exemplary aspect of the present disclosure may also include a thin film transistor having an inverted-staggered structure.

For convenience of description, only a driving thin film transistor is illustrated from among various thin film transistors that may be included in the flexible display device 100. And, a switching thin film transistor, a capacitor, or the like may also be included in the flexible display device 100.

In addition, when a signal is applied from the gate line to the switching thin film transistor, the switching thin film transistor transmits the signal from the data line to a gate electrode of the driving thin film transistor. The driving thin film transistor may transmit a current transferred through power lines to an anode 131 by the signal transmitted from the switching thin film transistor, and control light emission by the current transmitted to the anode 131.

Planarization layers 115c and 115d may be disposed on the thin film transistor 120 to protect the thin film transistor 120, to alleviate a step caused by the thin film transistor 120, and to reduce parasitic capacitance generated between the thin film transistor 120 and the gate line and the data line, and the light emitting elements 130.

The planarization layers 115c and 115d may be formed of one or more of acrylic resin, epoxy resin, phenolic resin, polyamides resin, polyimides resin, unsaturated polyesters resin, polyphenylene resin, polyphenylene sulfides resin and benzocyclobutene, but are not limited thereto.

The flexible display device 100 according to an exemplary aspect of the present disclosure may include a first planarization layer 115c and a second planarization layer 115d that are sequentially stacked. That is, the first planarization layer 115c may be disposed on the thin film transistor 120 and the second planarization layer 115d may be disposed on the first planarization layer 115c.

A buffer layer may be disposed on the first planarization layer 115c. The buffer layer may be composed of multiple layers of silicon oxide (SiOx) to protect components disposed on the first planarization layer 115c, and may be omitted depending on configurations and characteristics of the thin film transistor 120 and the light emitting element 130.

An intermediate electrode 125 may be connected to the thin film transistor 120 through a contact hole formed in the first planarization layer 115c. The intermediate electrode 125 is stacked so as to be connected to the thin film transistor 120, and the data line may also be formed in a multilayer structure.

The data line may be formed to have a structure in which a lower layer formed of the same material as the source electrode 122 and the drain electrode 123 and an upper layer formed of the same material as the intermediate electrode 125 are connected to each other. That is, the data line may be implemented in a structure in which two layers are connected in parallel to each other, and in this case, line resistance of the data line may be reduced.

Meanwhile, a passivation layer formed of an inorganic insulating layer such as silicon oxide (SiOx) or silicon nitride (SiNx) may be further disposed on the first planarization layer 115c and the intermediate electrode 125. The passivation layer may serve to prevent unnecessary electrical connections between components and to prevent contamination or damage from the outside, and may be omitted depending on configurations and characteristics of the thin film transistor 120 and the light emitting element 130.

The light emitting element 130 disposed on the second planarization layer 115d may include the anode 131, a light emitting unit 132, and a cathode 133.

The anode 131 may be disposed on the second planarization layer 115d.

The anode 131 serves to supply holes to the light emitting unit 132 and is connected to an intermediate electrode 125 through a contact hole in the second planarization layer 115d to thereby be electrically connected to the thin film transistor 120.

The anode 131 may be formed of a transparent conductive material, such as indium tin oxide (ITO), indium zinc oxide (IZO), or the like, but is not limited thereto.

When the flexible display device 100 is a top emission type display device that emits light to an upper portion thereof where the cathode 133 is disposed, it may further include a reflective layer such that the emitted light is reflected from the anode 131 to be smoothly emitted in a direction toward the upper portion where the cathode 133 is disposed.

The anode 131 may be a two-layer structure in which a transparent conductive layer formed of a transparent conductive material and a reflective layer are sequentially stacked, or a three-layer structure in which a transparent conductive layer, a reflective layer and a transparent conductive layer are sequentially stacked. The reflective layer may be formed of silver (Ag) or an alloy including silver.

A bank 115e disposed on the anode 131 and the second planarization layer 115d may define the sub-pixels by dividing areas that actually emits light. After forming a photoresist on the anode 131, the bank 115e may be formed by photolithography. Photoresist refers to a photosensitive resin whose solubility in a developer is changed by the action of light, and a specific pattern may be obtained by exposing and developing the photoresist. Types of photoresist may be classified into a positive photoresist and a negative photoresist. The positive photoresist is a photoresist where solubility of an exposed portion thereof in the developer is increased by exposure. When the positive photoresist is developed, a pattern from which exposed portions are removed is obtained. The negative photoresist is a photoresist where solubility of the exposed portion thereof in the developer is significantly lowered by the exposure. When the negative photoresist is developed, a pattern from which non-exposed portions are removed is obtained.

A FMM (Fine Metal Mask) which is a deposition mask, may be used to form the light emitting unit 132 of the light emitting element 130.

In addition, to prevent damage that may occur due to contact with the deposition mask disposed on the bank 115e and to maintain a constant distance between the bank 115e and the deposition mask, a spacer 115f formed of one of polyimide which is a transparent organic material, photo acryl, and benzocyclobutene (BCB) may be disposed on the bank 115e.

The light emitting unit 132 may be disposed between the anode 131 and the cathode 133.

The light emitting unit 132 serves to emit light and may include at least one of a hole injection layer (HIL), a hole transport layer (HTL), a light emitting layer, an electron transport layer (ETL), and an electron injection layer (EIL), and some components may be omitted depending on a structure or characteristics of the flexible display device 100. Here, an electroluminescent layer and an inorganic emitting layer may be used as the light emitting layer.

The hole injection layer is disposed on the anode 131 to facilitate an injection of holes.

The hole transport layer is disposed on the hole injection layer to smoothly transport holes to the light emitting layer.

The light emitting layer is disposed on the hole transport layer and may include a material capable of emitting light of a specific color to thereby emit light of a specific color. In addition, a luminescent material may be formed using a phosphorescent material or a fluorescent material.

The electron injection layer may be further disposed on the electron transport layer. The electron injection layer is an organic layer that facilitates an injection of electrons from the cathode 133 and may be omitted depending on the structure and characteristics of the flexible display device 100.

Meanwhile, at a position adjacent to the light emitting layer, an electron blocking layer or a hole blocking layer that blocks a flow of holes or electrons is further disposed to thereby prevent a phenomenon in which when electrons are injected into the light emitting layer, the electrons move from the light emitting layer and pass to the adjacent hole transport layer or a phenomenon in which when holes are injected into the light emitting layer, the holes move from the light emitting layer and pass to the adjacent electron transport layer, so that luminous efficiency may be improved.

The cathode 133 is disposed on the light emitting unit 132 and serves to supply electrons to the light emitting unit 132. Since the cathode 133 needs to supply electrons, it may be formed of a metal material such as magnesium (Mg), silver-magnesium, which is a conductive material having a low work function, but is not limited thereto.

When the flexible display device 100 is a top emission type display device, the cathode 133 may be a transparent conductive oxide such as indium tin oxide (ITO), indium zinc oxide (IZO), indium tin zinc oxide (ITZO), zinc oxide (ZnO), and tin oxide (TO).

An encapsulation part 115g may be disposed on the light emitting element 130 to prevent the thin film transistor 120 and the light emitting element 130, which are components of the flexible display device 100, from being oxidized or damaged due to moisture, oxygen, or impurities introduced from the outside. The encapsulation part 115g may be formed by stacking a plurality of encapsulation layers, a foreign material compensation layer, and a plurality of barrier films.

The encapsulation layer may be disposed on the entire surface of an upper portion of the thin film transistor 120 and the light emitting element 130, and may be formed of one of silicon nitride (SiNx) or aluminum oxide (AlyOz) which is an inorganic material. However, aspects are not limited thereto. An encapsulation layer may be further disposed on the foreign material compensation layer disposed on the encapsulation layer.

The foreign material compensation layer is disposed on the encapsulation layer, and an organic material such as silicon oxycarbon (SiOCz), acrylic (acryl), or epoxy-based resin may be used for the foreign material compensation layer. However, aspects are not limited thereto. When a defect occurs due to a crack generated by a foreign material or particles that may be generated during a process, it may be compensated for by covering a curve and a foreign material by the foreign material compensation layer.

A barrier film may be disposed on the encapsulation layer and the foreign material compensation layer, whereby the flexible display device 100 may delay the penetration of oxygen and moisture from the outside. The barrier film is configured in the form of a light-transmissive and double-sided adhesive film, and may be composed of any one of olefin-based, acrylic-based, and silicon-based insulating materials. Alternatively, a barrier film composed of any one of COP (cycloolefin polymer), COC (cycloolefin copolymer) and PC (Polycarbonate) may be further stacked, but is not limited thereto.

FIG. 4B illustrates a structural cross-section Il-Il' of a bending area BA described in FIG.

Some components of FIG. 4B are substantially the same as or similar to those described in FIG. 4A, and thus, descriptions thereof will be omitted.

The gate signal and the data signal described with reference to FIGS. 1 to 3 are transmitted from the outside to the pixels disposed in the display area AA through the circuit lines disposed in the non-display area NA of the flexible display device 100, thereby allowing for light emission.

When the lines disposed in the non-display area NA including the bending area BA of the flexible display device 100 are formed in a single layer structure, a large amount of space for disposing the lines therein is required. After depositing a conductive material, the conductive material is patterned to have a desired line shape by a process such as an etching process or the like. However, there is a limitation in fineness of the etching process, and thus, a lot of space is required due to a limit to narrowing a gap between the lines. Consequently, the area of the non-display area NA increases, which may cause difficulty in implementing a narrow bezel.

In addition, in a case in which one line is used to transmit one signal, when a corresponding line cracks, a corresponding signal may not be transmitted.

In a process of bending the substrate 111, cracks may occur in the line itself, or cracks may occur in other layers and propagate to the line. In this manner, when a crack occurs in the line, a signal to be transmitted may not be transmitted.

Accordingly, the line disposed in the bending area BA of the flexible display device 100 according to the exemplary aspect of the present disclosure may be disposed as a double line of a first line 141 and a second line 142.

The first line 141 and the second line 142 are formed of a conductive material, and may be formed of a conductive material having excellent ductility in order to reduce the occurrence of cracks when bending the flexible substrate 111.

The first line 141 and the second line 142 may be formed of a conductive material having excellent ductility, such as gold (Au), silver (Ag), or aluminum (Al). The first line 141 and the second line 142 may be formed of one of various conductive materials used in the display area AA, and may be formed of molybdenum (Mo), chromium (Cr), titanium (Ti), nickel (Ni), neodymium (Nd), copper (Cu), and an alloy of silver (Ag) and magnesium (Mg). In addition, the first line 141 and the second line 142 may be formed of a multilayer structure including various conductive materials, and may be formed of a three-layer structure of titanium (Ti)/aluminum (Al)/titanium (Ti). However, aspects of the present disclosure are not limited thereto.

To protect the first line 141 and the second line 142, a buffer layer formed of an inorganic insulating layer may be disposed under the first line 141 and the second line 142. A passivation layer formed of an inorganic insulating layer is formed to surround upper and side portions of the first line 141 and the second line 142, thereby preventing a phenomenon in which the first line 141 and the second line 142 react with moisture or the like and are corroded.

The first line 141 and the second line 142 formed in the bending area BA are subjected to tensile force when bent. As described in FIG. 3, the lines extending on the substrate 111 in the same direction as a bending direction are subjected to the greatest tensile force, and a crack may occur there. If the crack is severe, disconnection may occur. Therefore, rather than forming the lines to extend in the bending direction, at least a portion of the lines disposed in an area including the bending area BA is formed to extend in a diagonal direction, which is a direction different from the bending direction, so that the tensile force may be minimized to reduce the occurrence of cracks. The line may be formed in a shape such as a rhombus shape, a triangular wave shape, a sinusoidal wave shape, a trapezoidal wave shape or the like, but is not limited thereto.

The first line 141 may be disposed on the substrate 111 and the first planarization layer 115c may be disposed on the first line 141. The second line 142 may be disposed on the first planarization layer 115c, and the second planarization layer 115d may be disposed on the second line 142. The first planarization layer 115c and the second planarization layer 115d may be formed of one or more of acrylic resin, epoxy resin, phenolic resin, polyamides resin, polyimides resin, unsaturated polyesters resin, polyphenylene resin, polyphenylene sulfides resin, and benzocyclobutene, but is not limited thereto.

A micro-coating layer 145 may be disposed on the second planarization layer 115d.

Since tensile force is applied to a line portion disposed on the substrate 111 when the substrate is bent to thereby occur cracks in the lines, the micro-coating layer 145 may serve to protect the lines by coating resin with a small thickness at a bending position.

Figure 5:
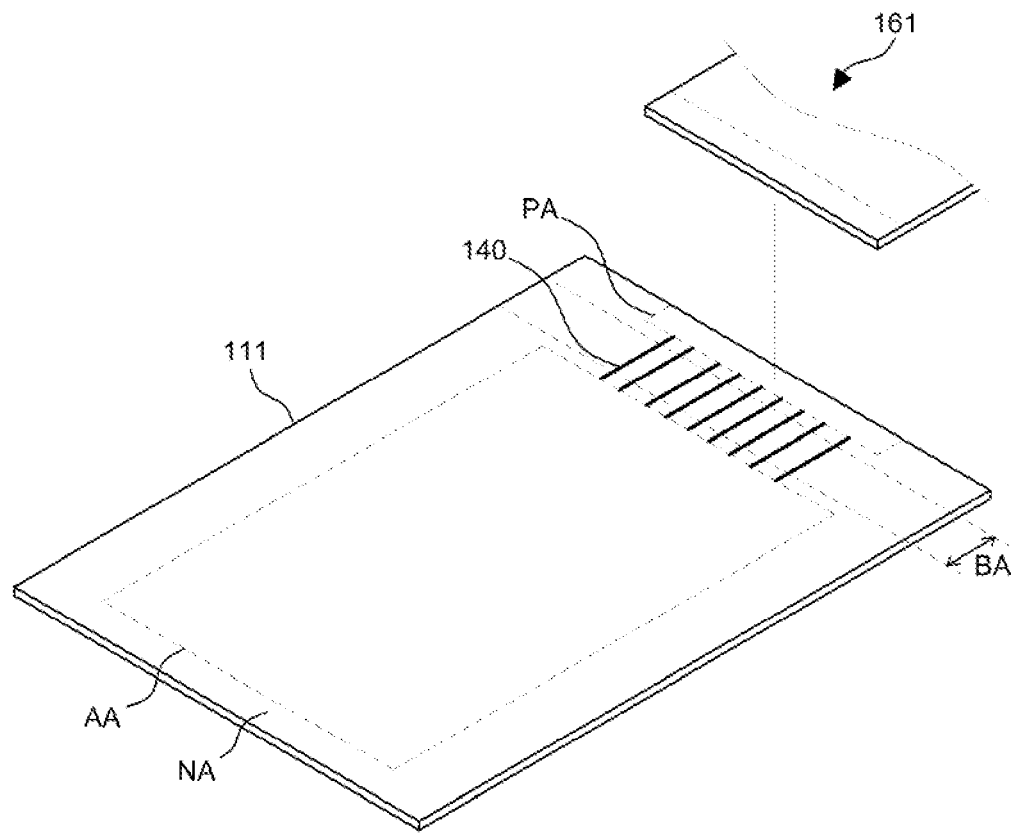
FIG. 5 is a perspective view of the flexible display device according to an exemplary aspect of the present disclosure.

FIG. 5 is a perspective view of the flexible display device according to an exemplary aspect of the present disclosure.

Figure 6:
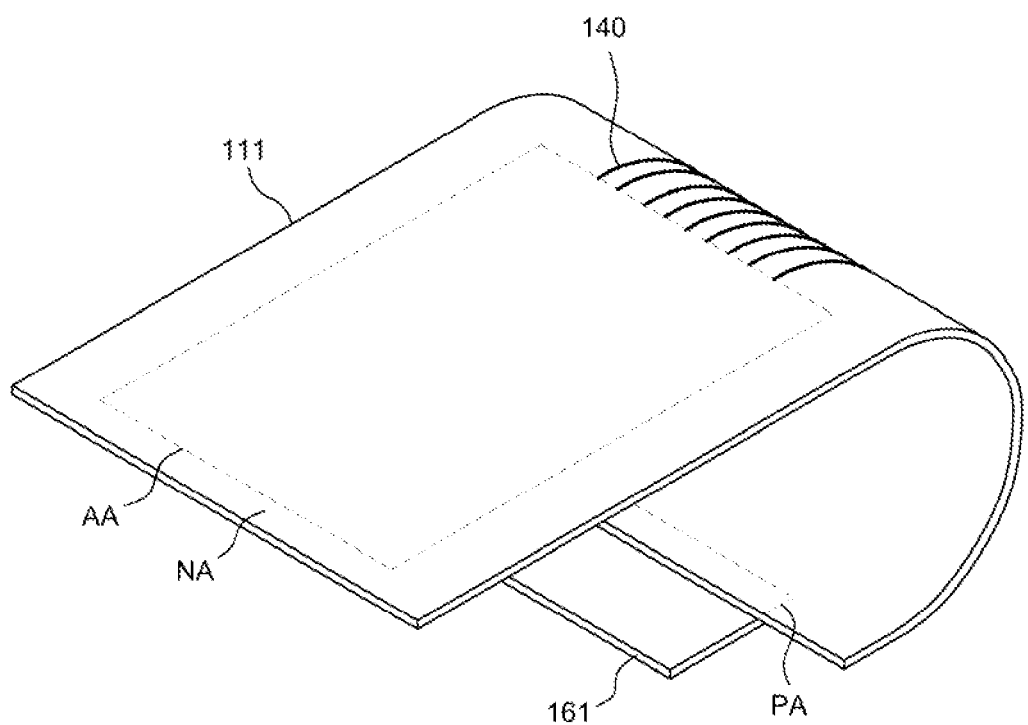
FIG. 6 is a perspective view illustrating a bending state of the flexible display device according to an exemplary aspect of the present disclosure.

FIG. 6 is a perspective view illustrating a bending state of the flexible display device according to an exemplary aspect of the present disclosure.

FIGS. 5 and 6 illustrate a case where one side of the flexible display device, for example, a lower portion of the flexible display device is bent.

With reference to FIG. 5, the flexible display device 100 according to an exemplary aspect of the present disclosure may include the substrate 111 and a circuit element 161.

The substrate 111 may be divided into a display area AA and a non-display area NA which is a bezel area surrounding an edge of the display area AA.

The non-display area NA may include a pad portion PA defined outside the display area AA. A plurality of sub-pixels may be disposed in the display area AA. The sub-pixels may be arranged in a manner of R (red), G (green) and B (blue), or in a manner of R, G, B, and W (white) in the display area AA to thereby realize a full color. The sub-pixels may be divided by gate lines and data lines that intersect each other.

The circuit element 161 may include bumps (or terminals). The bumps of the circuit element 161 may be respectively bonded to pads of the pad portion PA through anisotropic conductive films. The circuit element 161 may be a chip on film (COF) in which a driver IC (Integrated Circuit) is mounted on a flexible film. In addition, the circuit element 161 may be implemented as a chip on glass (COG) type in which it is directly bonded to pads on a substrate by a COG process. Further, the circuit element 161 may be a flexible circuit such as a flexible flat cable (FFC) or a flexible printed circuit (FPC). In the following aspects, the COF is mainly described as an example of the circuit element 161, but the present disclosure is not limited thereto.

The driving signals supplied through the circuit element 161, for example, a gate signal and a data signal may be supplied to the gate line and the data line of the display area AA through the circuit lines 140 such as routing lines.

In the flexible display device 100, a sufficient space in which the pad portion PA, the circuit element 161, and the like may be positioned should be secured, in addition to the display area AA where an input image is implemented. Such a space corresponds to a bezel area, and the bezel area may be recognized by a user positioned in the front of the flexible display device 100 and may be a factor in lowering aesthetics.

With reference to FIG. 6, the flexible display device 100 according to an exemplary aspect of the present disclosure may be bent in a rear direction such that a lower edge of the substrate 111 has a predetermined curvature.

The lower edge of the substrate 111 may correspond to an outside portion of the display area AA, and may correspond to an area where the pad portion PA is positioned. As the substrate 111 is bent, the pad portion PA may be positioned to overlap the display area AA in the rear direction of the display area AA. Accordingly, a bezel area recognized from the front of the flexible display device 100 may be minimized. Accordingly, a bezel width is reduced to thereby provide an effect of improving an aesthetic sense.

To this end, the substrate 111 may be formed of a flexible, bendable material. For example, the substrate 111 may be formed of a plastic material such as polyimide (PI). In addition, the circuit lined 140 may be formed of a material having flexibility. For example, the circuit lined 140 may be formed of a material such as a metal nano wire, metal mesh, or carbon nanotube (CNT). However, aspects are not limited thereto.

The circuit lines 140 may extend from the display area AA to be disposed in the bending area BA. That is, the circuit lines 140 may extend along an outer circumferential surface of the substrate 111 in the bending area BA. Since the circuit lines 140 are positioned in the bending area to have a predetermined curvature, they may easily crack or may be easily open due to stress acting during bending.

More specifically, when bending the lower edge of the substrate 111, a neutral plane NP is positioned in the bending area BA of the substrate 111. The neutral plane NP is a surface where a stress state is 0 during the bending and refers to a surface bendable while maintaining its original length without being increased or decreased when a bending moment is applied. During the bending, compressive stress acts on an inside of a bending curvature and tensile stress acts on an outside of the bending curvature. At this time, elements disposed in regions on which the tensile stress acts may easily crack, compared to elements disposed in regions on which the compressive stress acts on. That is, the elements are more susceptible to cracking when subjected to the tensile stress than when subjected to the compressive stress during the bending.

In a structure in which the edge of the substrate 111 is bent, since the circuit lines 140 are subjected to tensile stress when bending the substrate 111, defects such as cracks may easily occur in the bending area.

Figure 7:
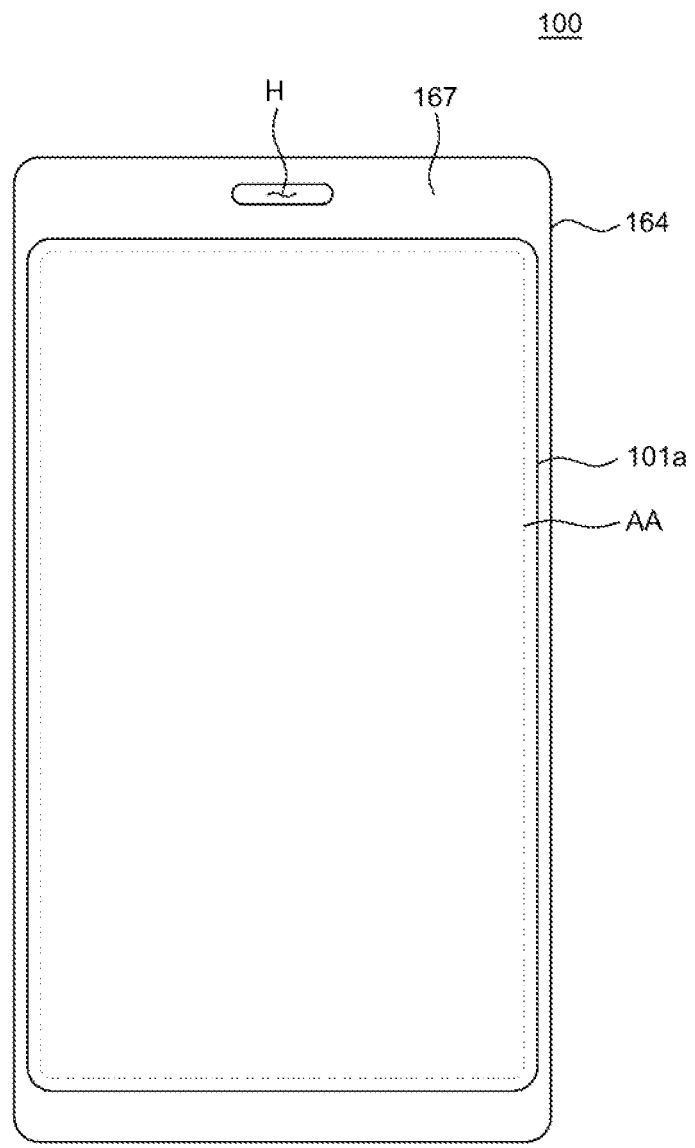
FIG. 7 is a plan view of the flexible display device according to an exemplary aspect of the present disclosure.

FIG. 7 is a plan view of the flexible display device according to an exemplary aspect of the present disclosure.

Figure 8:
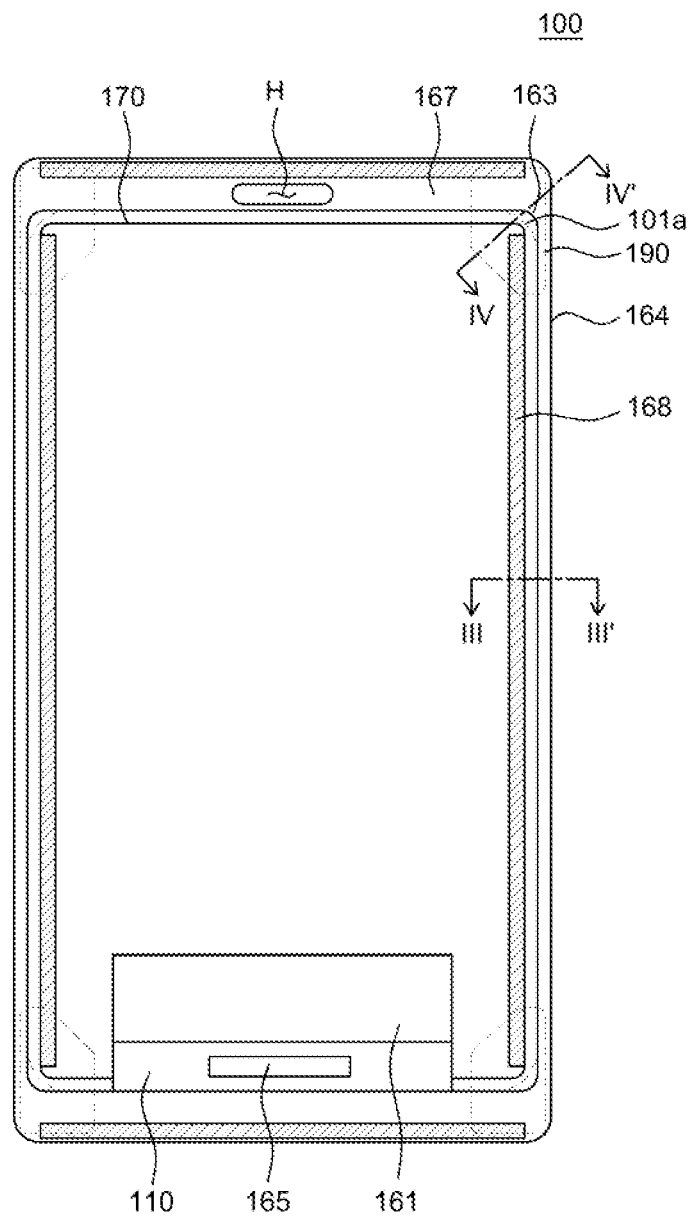
FIG. 8 is a rear view of the flexible display device according to an exemplary aspect of the present disclosure.

FIG. 8 is a rear view of the flexible display device according to an exemplary aspect of the present disclosure.

Figure 9:
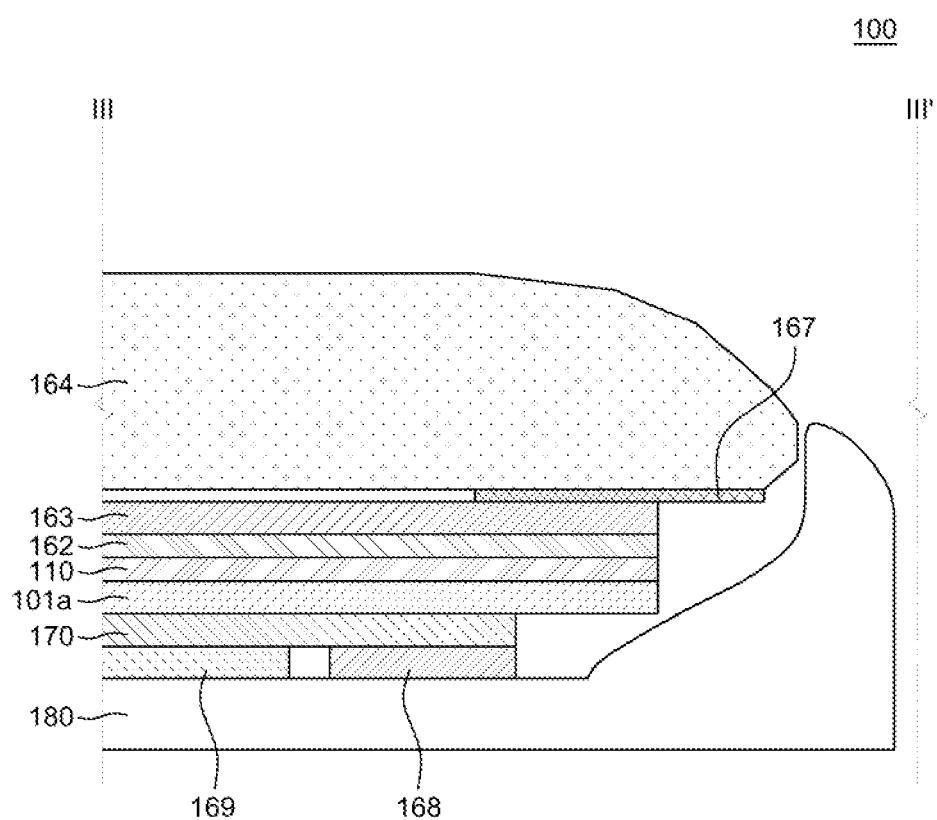
FIG. 9 is a cross-sectional view taken along line III-III' of FIG. 8.

FIG. 9 is a cross-sectional view taken along line III-III' of FIG. 8.

Figure 10:
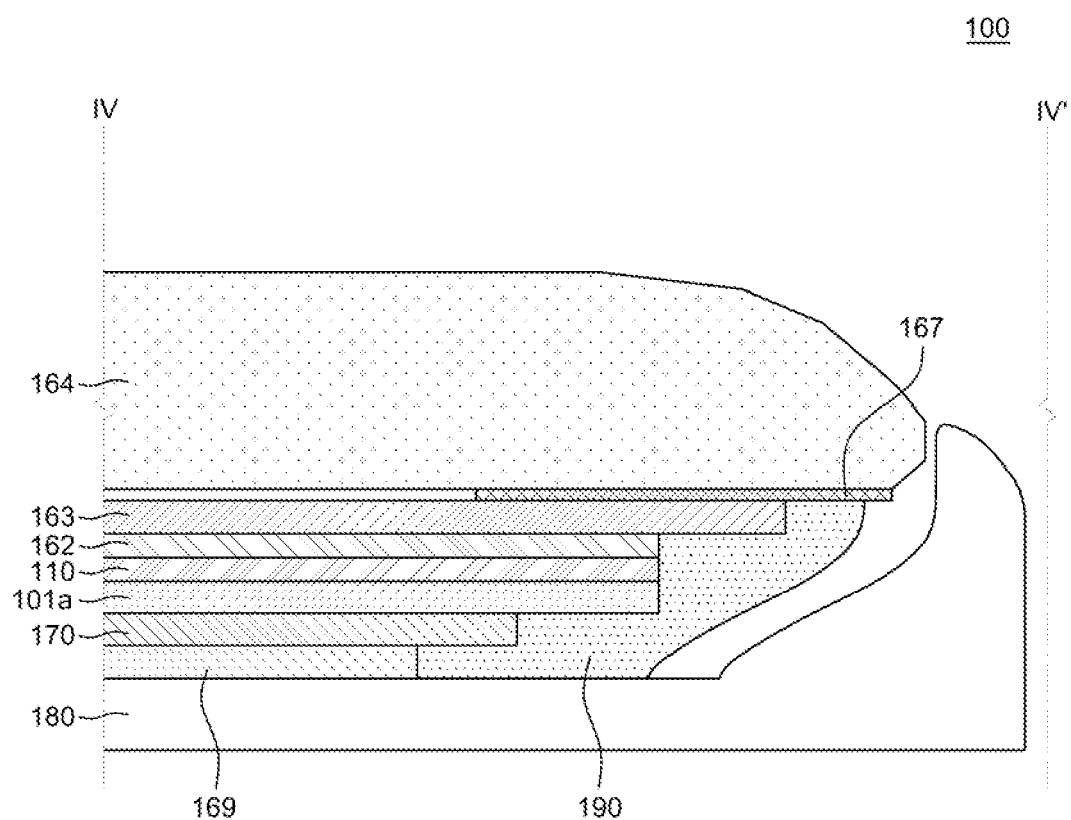
FIG. 10 is a cross-sectional view taken along line IV-IV' of FIG. 8.

FIG. 10 is a cross-sectional view taken along line IV-IV' of FIG. 8.

FIGS. 7 and 8 provide illustrations with omission of a middle frame, for convenience, and FIGS. 9 and 10 provide illustrations with a middle frame 180.

FIG. 9 illustrates a cross-section of a right edge of the flexible display device 100 according to an exemplary aspect of the present disclosure, by way of example, and FIG. 10 illustrates a cross-section of a corner of the flexible display device 100 according to an exemplary aspect of the present disclosure, by way of example.

FIGS. 7 to 10 each shows an example in which a hole H for a camera, an optical sensor, a receiver, or a fingerprint sensor is formed in an upper side of the flexible display device 100, but is not limited thereto.

With reference to FIGS. 7 to 10, the flexible display device 100 according to an exemplary aspect of the present disclosure includes a display panel 110, a polarizing plate 162, and a cover glass 164.

The display panel 110 includes a first flat portion and a second flat portion, and a curved portion positioned between the first flat portion and the second flat portion. The first flat portion corresponds to the display area AA having a plurality of sub-pixels, and is an area maintained in a flat state. The second flat portion is an area facing the first flat portion, and corresponds to the pad portion PA having pads bonded to the circuit element 161. The second flat portion is an area maintained in a flat state. The curved portion is an area in which circuit lines 140 connecting the display area AA and the pad portion PA to each other are provided, and is an area maintained in a bending state with a predetermined curvature.

In this case, for example, the curved portion may have a "⊃" shape. That is, the curved portion extends from the first flat portion and bends at an angle of 180 degrees in a rear direction. Accordingly, the second flat portion extending from the curved portion may be positioned to overlap the first flat portion in the rear direction of the first flat portion. That is, the circuit element 161 bonded to the second flat portion of the display panel 110 may be positioned in the rear direction of the first flat portion of the display panel 110.

Although not illustrated, a barrier film may be disposed on the display panel 110.

The barrier film is a component for protecting various components of the display panel 110 and may be disposed to correspond to at least the display area AA of the display panel 110. The barrier film is not necessarily required, and may be deleted depending on a structure of the flexible display device 100. The barrier film may be configured to include an adhesive material. The adhesive material may be a thermosetting or self-curing adhesive, and may be formed of a material such as pressure sensitive adhesive (PSA), so that it may serve to fix the polarizing plate 162 on the barrier film.

The polarizing plate 162 disposed on the barrier film may suppress reflection of external light on the display area AA. When the display device 100 is externally used, external natural light may be introduced and may be reflected by a reflective layer included in an anode of an electroluminescent element, or reflected by an electrode formed of metal disposed under the electroluminescent element. An image of the display device 100 may not be recognized well by the reflected light. The polarizing plate 162 polarizes light introduced from the outside in a specific direction, and prevents the reflected light from being re-emitted to the outside of the display device 100. The polarizing plate 162 may be disposed on the display area AA, but is not limited thereto.

The polarizing plate 162 may be a polarizing plate composed of a polarizer and a protective film protecting the polarizer, or may be formed by coating a polarizing material for flexibility.

An adhesive layer 163 may be disposed on the polarizing plate 162, whereby the cover glass 164 for protecting an exterior of the display device 100 may adhere to and disposed on the polarizing plate 162. That is, the cover glass 164 may be provided to cover the entire surface of the display panel 110 and serve to protect the display panel 110.

The adhesive layer 163 may include an optically clear adhesive (OCA).

A light blocking pattern 167 may be disposed on four edges of the cover glass 164.

The light blocking pattern 167 may be disposed on edges of a rear surface of the cover glass 164.

The light blocking pattern 167 may be disposed to overlap a portion of the display panel 110, the adhesive layer 163, and the polarizing plate 162 that are disposed under the light blocking pattern 167.

The light blocking pattern 167 may be applied with black ink.

Although not shown, a touch screen panel may be further included on the display panel 110. In this case, the polarizing plate 162 may be positioned over the touch screen panel. When the touch screen panel is included, the cover glass 164 may be provided to cover at least a portion of the touch screen panel.

The touch screen panel may include a plurality of touch sensors. The touch sensor may be disposed at a position corresponding to the display area AA of the display panel 110. The touch sensor may include at least one of a mutual capacitance sensor and a self-capacitance sensor.

The mutual capacitance sensor includes a mutual capacitance formed between two touch electrodes. A mutual capacitance sensing circuit may apply a driving signal (or a stimulus signal) to any one of the two electrodes and sense a touch input based on variance of electric charges in the mutual capacitance through the other electrode. When a conductor approaches the mutual capacitance, the amount of electric charges in the mutual capacitance decreases, so that a touch input or gesture can be detected.

The self-capacitance sensor includes a self-capacitance formed in each of sensor electrodes. A self-capacitance sensing circuit can supply an electric charge to each sensor electrode and sense a touch input based on variance of electric charges in the self-capacitance. When a conductor approaches the self-capacitance, capacitance of the sensor is connected in parallel to capacitance of the conductor, thereby increasing a capacitance value. Therefore, in the case of a self-capacitance, when a touch input is sensed, the capacitance value of the sensor increases.

A plurality of holes (or openings) H may be provided in an upper side of the display device 100. For example, the holes H may include an optical sensor hole, a receiver hole, a camera hole, and a fingerprint sensor hole (or a home button hole).

Back plates 101a and 101b may be disposed under the display panel 110. When the substrate of the display panel 110 is formed of a plastic material such as polyimide, a manufacturing process of the flexible display device 100 is conducted in a situation in which a support substrate formed of glass is disposed under the display panel 110. After the manufacturing process is completed, the support substrate may be separated and released.

Since a component for supporting the display panel 110 is required even after the support substrate is released, the back plates 101a and 101b for supporting the display panel 110 may be disposed under the display panel 110.

The back plates 101a and 101b may prevent foreign materials from being attached to a lower portion of the substrate, and may serve to buffer impacts from the outside.

The back plates 101a and 101b may be disposed adjacent to the bending area BA in other areas of the display panel 110 excluding the bending area BA.

In this case, the back plates 101a and 101b may include a first back plate 101a and a second back plate 101b positioned on a rear surface of the first flat portion and a rear surface of the second flat portion, respectively. The first back plate 101a reinforces rigidity of the first flat portion, so that the first flat portion may be maintained in a flat state. The second back plate 101b reinforces rigidity of the second flat portion, so that the second flat portion may be maintained in a flat state. Meanwhile, to secure flexibility of the curved portion and facilitate a control of the neutral plane using the micro-coating layer 145, the back plates 101a and 101b may not be disposed on a rear surface of the curved portion.

The back plates 101a and 101b may be formed of a plastic thin film formed of polyimide (PI), polyethylene naphthalate (PEN), polyethylene terephthalate (PET), polymers, or combinations of these polymers.

A cushion tape 170 may be disposed on a rear surface of the first back plate 101a and between two, the back plates 101a and 10b.

The cushion tape 170 may be attached to the rear surface of the first back plate 101a using an adhesive.

The adhesive may have an embossing pattern.

The adhesive may be composed of pressure sensitive adhesive (PSA).

The cushion tape 170 may be compressed when receiving external force to thereby absorb impacts.

The cushion tape 170 may include a heat radiation sheet on a rear surface thereof.

The heat radiation sheet may be provided for heat radiation and a ground and function to protect the rear surface.

The heat radiation sheet may be composed of a composite heat radiation sheet.

A fixing tape 168 for a waterproof function and fixation with the middle frame 180 may be attached to four edges, except for corners, on the rear surface of the cushion tape 170 according to an exemplary aspect of the present disclosure. The fixing tape 168 may be divided into four fixing tapes. However, the present disclosure is not limited thereto.

Specifically, the fixing tape 168 according to an exemplary aspect of the present disclosure may be attached to the rear surface of the light blocking pattern 167 in an upper side and a lower side of the flexible display device 100, and may be attached to the rear surface of the cushion tape 170 in a left side and a right side of the flexible display device 100. However, the present disclosure is not limited thereto.

A conductive tape 169 for the ground may be disposed inside the fixing tape 168.

The conductive tape 169 may be attached to the rear surface of the cushion tape 170.

Meanwhile, the flexible display device 100 according to an exemplary aspect of the present disclosure is characterized in that the adhesive layer 163 protrudes more than the polarizing plate 162 and the display panel 110 at corners of the flexible display device 100, for waterproofing and sealing. And, the flexible display device 100 according to an exemplary aspect of the present disclosure is characterized in that a sealing material 190 is provided on side surfaces of the polarizing plate 162, the adhesive layer 163, the display panel 110, the first back plate 101a, the cushion tape 170, and the fixing tape 168.

In the prior art, it was difficult to implement water sealing as the adhesive layer under the cover glass had an under-cut structure in which it is retracted than the polarizer. In other words, due to the under-cut structure of the adhesive layer, an unsealed area exists at a portion of the corner, causing vulnerability to waterproofing and air leak. In addition, the polarizing plate is exposed and thus, vulnerable to contamination such as discoloration of the polarizing plate during chemical resistance evaluation.

Accordingly, the present disclosure is characterized by providing the flexible display device 100 that improves a waterproof performance and prevents chemical contamination.

To this end, first, the fixing tape 168 is attached to four sides of the flexible display device 100. However, even with the cross-attachment of the fixing tape 168, gaps are generated in the corners, causing vulnerability to contamination in chemical resistance evaluation according to exposure of the polarizing plate 162.

Accordingly, it is characterized in that the sealing material 190 is additionally applied to a corner region where it is difficult to guarantee waterproofing by the fixing tape 168 and that the adhesive layer 163 is configured to protrude more than the polarizing plate 162 and the display panel 110. In this case, a portion of an upper surface and the side surface of the adhesive layer 163 protruding may be covered by the sealing material 190 and may not be exposed outwardly.

The sealing material 190 may cover not only a portion of the upper surface and the entire side surface of the protruding adhesive layer 163, but may also cover a portion of upper surfaces and the side surfaces of the polarizing plate 162, the display panel 110, and the first back plate 101a, and the side surface of the cushion tape 170 in the corner region.

Also, the sealing material 190 may cover a portion of the light blocking pattern 167.

The sealing material 190 may be cured by ultraviolet light or heat.

A degree of protrusion of the adhesive layer 163 may be greater than the display panel 110 by a minimum of 0.3 mm, by way of example, in consideration of a tolerance for under-cut prevention.

The flexible display device 100 according to an exemplary aspect of the present disclosure shows an example in which the protruding structure of the adhesive layer 163 is applied to all of four corners of the flexible display device 100, but the present disclosure is not limited thereto. In addition, it is unnecessary to apply the protruding structure of the adhesive layer 163 and the sealing material 190 to regions excluding the four corners.

The flexible display device 100 according to an exemplary aspect of the present disclosure provides an effect of improving product quality by improving a waterproof performance and minimizing chemical contamination. In addition, it is advantageous in that there is no interference between processes and the degree of protrusion of the adhesive layer 163 is manageable.

Meanwhile, the micro-coating layer 145 may be disposed on the bending area BA of the display panel 110. The micro-coating layer 145 may be formed to cover one side of the barrier film.

Since tensile force is applied to the circuit lines disposed on the display panel 110 when the display panel 110 is bent to thereby occur cracks in the lines, the micro-coating layer 145 may serve to protect the lines by coating resin with a small thickness at a bending position.

The micro-coating layer 145 may be formed of an acrylic material such as an acrylate polymer, but is not limited thereto.

The micro-coating layer 145 may adjust the neutral plane of the bending area BA.

As described above, the neutral plane may mean a virtual surface that is not stressed because compressive force and tensile force applied to structures cancel each other out when the structures are bent. When two or more structures are stacked, a virtual neutral plane may be formed between the structures. When the entirety of the structures is bent in one direction, the structures disposed in the bending direction with respect to the neutral plane are compressed by bending, and thus, are subjected to compressive force. On the contrary, the structures disposed in a direction opposite to the bending direction with respect to the neutral plane are stretched by bending and thus, are subjected to tensile force. In addition, since the structures are more vulnerable when they are subjected to tensile force among the same levels of compressive force and tensile force, the probability of crack occurrence is higher when they are subjected to tensile force.

The flexible substrate of the display panel 110 disposed under the neutral plane is compressed and thus, subjected to compressive force. The circuit lines 140 disposed above the neutral plane are subjected to tensile force and due to the tensile force, cracks may occur in the circuit lines. Therefore, to minimize the tensile force to be received by the circuit lines, the neutral plane may be positioned above the circuit lines.

By disposing the micro-coating layer 145 on the bending area BA, the neutral plane may be raised upwardly and the neutral plane is formed at a position the same as that of the circuit lines or the circuit lines are located at a position higher than that of the neutral plane. Thus, the circuit lines are not stressed or are subjected to compressive force during bending, whereby the occurrence of cracks may be suppressed.

The circuit element 161 may be connected to an end portion of the second flat portion of the display panel 110.

Various lines for transmitting signals to the pixels disposed in the display area AA may be formed on the circuit element 161.

The circuit element 161 may be formed of a material having flexibility so that it is bendable.

A driver IC 165 may be mounted on the second flat portion of the display panel 110 and be connected to the lines formed on the circuit element 161 to thereby provide the sub-pixels disposed in the display area AA with driving signals and data.

The circuit element 161 may be a flexible printed circuit board (FPCB).

One end of the circuit element 161 may be connected to the display panel 110 and the other end thereof may be bent and attached to the cushion tape 170.

Meanwhile, in the left side and the right side of the flexible display device according to the exemplary aspect of the present disclosure, the fixing tape may be attached to the rear surface of the light blocking pattern, not the rear surface of the cushion tape, and no hole may be provided depending on a model. It will be described in detail through other aspects of the present disclosure.

Figure 11:
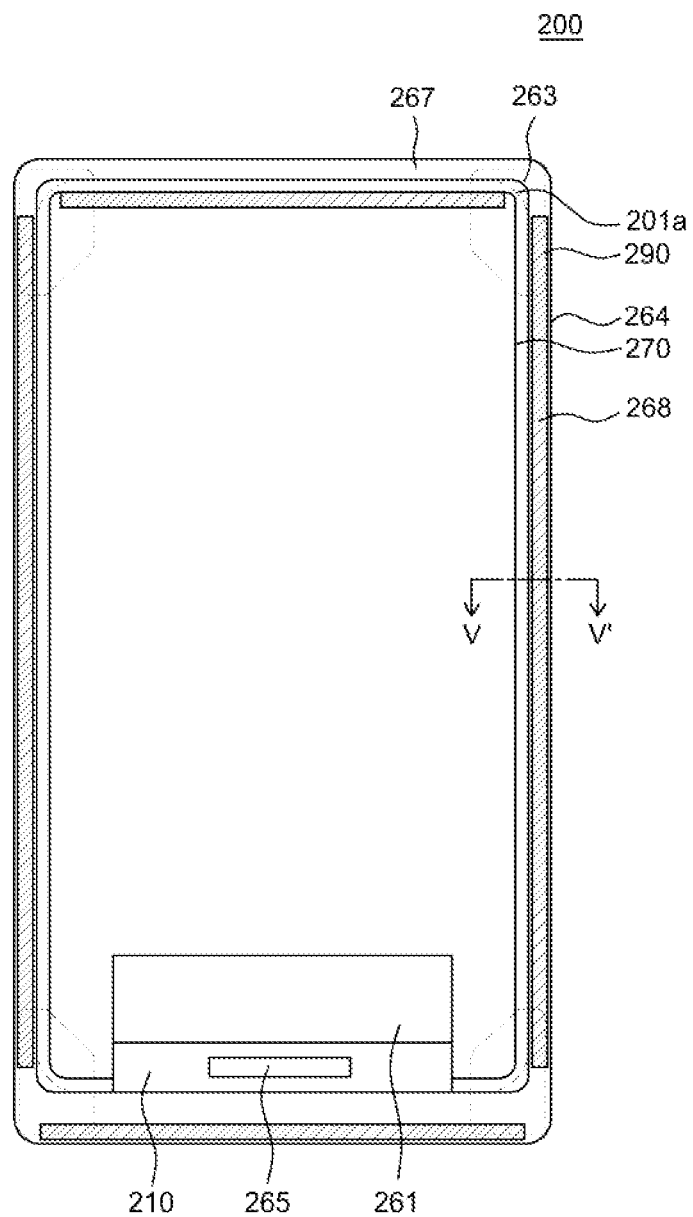
FIG. 11 is a rear view of a flexible display device according to another exemplary aspect of the present disclosure.

FIG. 11 is a rear view of a flexible display device according to another exemplary aspect of the present disclosure.

Figure 12:
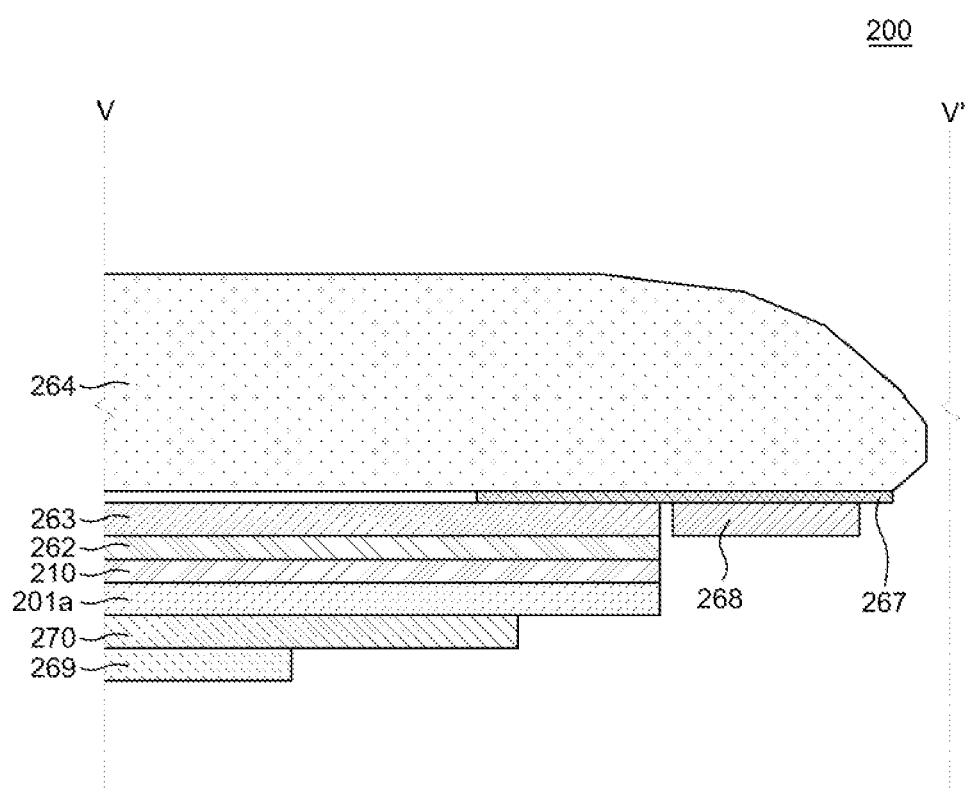
FIG. 12 is a cross-sectional view taken along line V-V' of FIG. 11.

FIG. 12 is a cross-sectional view taken along line V-V' of FIG. 11.

A flexible display device 200 according to another exemplary aspect of the present disclosure, illustrated in FIG. 11 and FIG. 12 has substantially the same configuration as that of the flexible display device 100 of FIGS. 7 to 10, with the exception that a fixing tape 268 is attached to a rear surface of a light blocking pattern 267, not a rear surface of a cushion tape 270, in a left side and a right side of the flexible display device 200, and a hole is not provided.

FIGS. 11 and 12 provide illustrations with omission of a middle frame, for convenience.

FIG. 12 illustrates a cross-section of a right edge of the flexible display device 200 according to another exemplary aspect of the present disclosure, by way of example.

With reference to FIGS. 11 and 12, the flexible display device 200 according to another exemplary aspect of the present disclosure may include a display panel 210, a polarizing plate 262, and a cover glass 264.

Although not illustrated, a barrier film may be disposed on the display panel 210.

The polarizing plate 262 may be disposed on the barrier film.

The polarizing plate 262 may be a polarizing plate composed of a polarizer and a protective film that protects the polarizing plate, and may be formed by coating a polarizing material for flexibility.

An adhesive layer 263 may be disposed on the polarizing plate 162, whereby the cover glass 264 for protecting an exterior of the display device 200 may adhere to and disposed on the polarizing plate 262.

The adhesive layer 263 may include an optically clear adhesive (OCA).

The light blocking pattern 267 may be disposed on four edges of the cover glass 264.

The flexible display device 200 according to another exemplary aspect of the present disclosure does not include a hole in an upper side thereof, so that a width of the light blocking pattern 267 disposed in the upper side may be formed to be relatively narrow as compared to an exemplary aspect of the present disclosure described above. However, it is not limited thereto.

The light blocking pattern 267 may be disposed on edges of a rear surface of the cover glass 264.

The light blocking pattern 267 may be disposed to overlap a portion of the display panel 210, the adhesive layer 263, and the polarizing plate 262 that are disposed under the light blocking pattern 267.

The light blocking pattern 267 may be applied with black ink.

Although not shown, a touch screen panel may be further included on the display panel 210. In this case, the polarizing plate 262 may be positioned over the touch screen panel. When the touch screen panel is included, the cover glass 264 may be provided to cover at least a portion of the touch screen panel.

Back plates 201a may be disposed under the display panel 210.

The back plates 201a may be disposed adjacent to a bending area in other areas of the display panel 210 excluding the bending area.

The back plates 201a may include a first back plate 201a and a second back plate (not shown) positioned on a rear surface of the first flat portion and a rear surface of the second flat portion, respectively. The first back plate 201a reinforces rigidity of the first flat portion, so that the first flat portion may be maintained in a flat state. The second back plate reinforces rigidity of the second flat portion, so that the second flat portion may be maintained in a flat state. Meanwhile, to secure flexibility of the curved portion and facilitate a control of the neutral plane using the micro-coating layer, the back plates 201a may not be disposed on a rear surface of the curved portion.

The cushion tape 270 may be disposed on a rear surface of the first back plate 201a and between two back plates 201a.

The cushion tape 270 may be attached to the rear surface of the first back plate 201a using an adhesive.

The adhesive may have an embossing pattern.

The adhesive may be composed of pressure sensitive adhesive (PSA).

The cushion tape 270 may be compressed when receiving external force to thereby absorb impacts.

The cushion tape 270 may include a heat radiation sheet on a rear surface thereof.

The heat radiation sheet may be provided for heat radiation and a ground and function to protect the rear surface.

The heat radiation sheet may be composed of a composite heat radiation sheet.

A conductive tape 269 for the ground may be disposed on the rear surface of the cushion tape 270.

Meanwhile, a fixing tape 268 according to another exemplary aspect of the present disclosure may be attached to the rear surface of the cushion tape 270, in an upper side of the flexible display device 200, and may be attached to the rear surface of the light blocking pattern 267, in a lower side, a left side, and a right side of the flexible display device 200. In addition, the fixing tape 268 may be divided into four fixing tapes. However, the present disclosure is not limited thereto.

In addition, in the same manner as an exemplary aspect of the present disclosure described above, the flexible display device 200 according to another exemplary aspect of the present disclosure is characterized in that the adhesive layer 263 protrudes more than the polarizing plate 262 and the display panel 210 at corners of the flexible display device 200, for waterproofing and sealing. And, the flexible display device 200 according to an exemplary aspect of the present disclosure is characterized in that a sealing material 290 is provided on side surfaces of the polarizing plate 262, the adhesive layer 263, the display panel 210, the first back plate 201a, the cushion tape 270, and the fixing tape 268.

That is, the fixing tape 268 may be attached to four sides of the flexible display device 200. In addition, it is characterized in that the sealing material 290 is additionally applied to a corner region where it is difficult to guarantee waterproofing by the fixing tape 268 and at the same time, the adhesive layer 263 is configured to protrude more than the polarizing plate 262 and the display panel 210. In this case, a portion of an upper surface and a side surface of the adhesive layer 263 protruding may be covered by the sealing material 290 and may not be exposed outwardly.

The sealing material 290 may cover not only a portion of the upper surface and the entire side surface of the protruding adhesive layer 163, but may also cover a portion of upper surfaces and the side surfaces of the polarizing plate 262, the display panel 210, and the first back plate 201a, and a side surface of the cushion tape 170 in the corner region.

Also, the sealing material 290 may cover a portion of the light blocking pattern 267.

The sealing material 290 may be cured by ultraviolet light or heat.

The flexible display device 200 according to an exemplary aspect of the present disclosure shows an example in which the protruding structure of the adhesive layer 263 is applied to all of four corners of the flexible display device 200, in the same manner as an exemplary aspect of the present disclosure described above, but the present disclosure is not limited thereto. In addition, it is unnecessary to apply the protruding structure of the adhesive layer 263 and the sealing material 290 to regions excluding the four corners.

Meanwhile, a micro-coating layer may be disposed on the bending area of the display panel 210. The micro-coating layer may be formed to cover one side of the barrier film.

A circuit element 261 may be connected to an end portion of the second flat portion of the display panel 210.

Various lines for transmitting signals to pixels disposed in a display area may be formed on the circuit element 261.

The circuit element 261 may be formed of a material having flexibility so that it is bendable.

A driver IC 265 may be mounted on the second flat portion of the display panel 210 and be connected to the lines formed on the circuit element 261 to thereby provide sub-pixels disposed in the display area with driving signals and data.

The circuit element 261 may be a flexible printed circuit board (FPCB).

One end of the circuit element 261 may be connected to the display panel 210 and the other end thereof may be bent and attached to the cushion tape 270.

Meanwhile, in the upper side of the flexible display device according to the exemplary aspect of the present disclosure, the fixing tape may be attached to the rear surface of the cushion tape, not the rear surface of the light blocking pattern, and no hole may be provided depending on a model. It will be described in detail through other aspects of the present disclosure.

Figure 13:
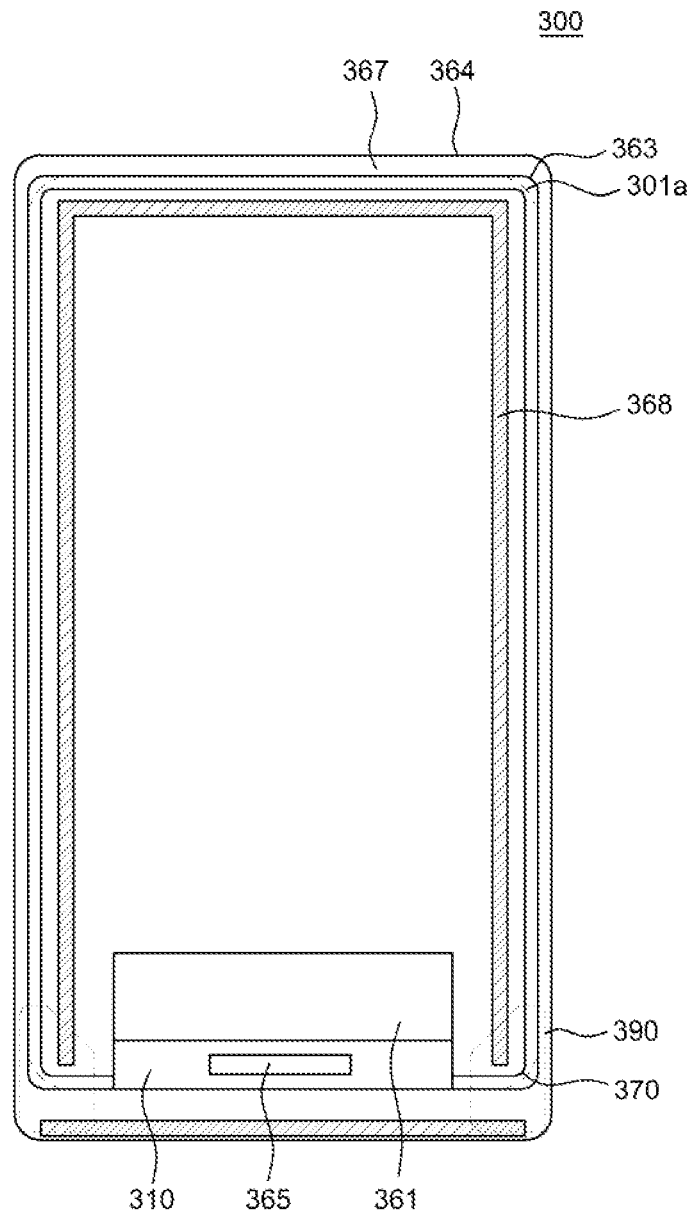
FIG. 13 is a rear view of a flexible display device according to still another exemplary aspect of the present disclosure.

FIG. 13 is a rear view of a flexible display device according to still another exemplary aspect of the present disclosure.

A flexible display device 300 according to still another exemplary aspect of the present disclosure, illustrated in FIG. 13 has substantially the same configuration as that of the flexible display device 100 of FIGS. 7 to 10, with the exception that a fixing tape 368 is attached to a rear surface of a cushion tape 370, not a rear surface of a light blocking pattern 367, in an upper side of the flexible display device 300, a sealing material is provided only at a lower corner of the flexible display device 300, and a hole is not provided.

FIG. 13 provides an illustration with omission of a middle frame, for convenience.

For your reference, a cross-sectional structure of a right edge of the flexible display device 300 according to still another exemplary aspect of the present disclosure is substantially the same as that of the flexible display device 100 according to an exemplary aspect of the present disclosure, and thus, is omitted for convenience.

With reference to FIG. 13, the flexible display device 300 according to still another exemplary aspect of the present disclosure may include a display panel 310, a polarizing plate, and a cover glass 364.

A barrier film may be disposed on the display panel 310.

The polarizing plate may be disposed on the barrier film.

An adhesive layer 363 may be disposed on the polarizing plate, whereby the cover glass 364 for protecting an exterior of the display device 300 may adhere to and disposed on the polarizing plate.

The adhesive layer 363 may include an optically clear adhesive (OCA).

The light blocking pattern 367 may be formed on four edges of the cover glass 364.

The flexible display device 300 according to still another exemplary aspect of the present disclosure does not include a hole in an upper side thereof, so that a width of the light blocking pattern 367 in the upper side may be formed to be relatively narrow as compared to an exemplary aspect of the present disclosure described above. However, it is not limited thereto.

The light blocking pattern 367 may be disposed on edges of a rear surface of the cover glass 364.

The light blocking pattern 367 may be formed to overlap a portion of the display panel 310, the adhesive layer 363, and the polarizing plate that are disposed under the light blocking pattern 367.

The light blocking pattern 367 may be applied with black ink.

Although not shown, a touch screen panel may be further included on the display panel 310. In this case, the polarizing plate may be positioned over the touch screen panel. When the touch screen panel is included, the cover glass 364 may be provided to cover at least a portion of the touch screen panel.

Back plates 301a may be disposed under the display panel 310.

The back plates 301a may be disposed adjacent to a bending area in other areas of the display panel 310 excluding the bending area.

The back plates 301a may include a first back plate 301a and a second back plate (not shown) positioned on a rear surface of the first flat portion and a rear surface of the second flat portion, respectively. The first back plate 301a reinforces rigidity of the first flat portion, so that the first flat portion may be maintained in a flat state. The second back plate reinforces rigidity of the second flat portion, so that the second flat portion may be maintained in a flat state. Meanwhile, to secure flexibility of the curved portion and facilitate a control of the neutral plane using the micro-coating layer, the back plates 301a may not be disposed on a rear surface of the curved portion.

The cushion tape 370 may be disposed on a rear surface of the first back plate 301a and between two back plates 301a.

The cushion tape 370 may be attached to the rear surface of the first back plate 301a using an adhesive.

A conductive tape for the ground may be disposed on the rear surface of the cushion tape 370.

Meanwhile, the fixing tape 368 according to still another exemplary aspect of the present disclosure may be attached to the rear surface of the cushion tape 370, in an upper side, a left side, and a right side of the flexible display device 300, and may be attached to the rear surface of the light blocking pattern 367, in a lower side of the flexible display device 300. In addition, the fixing tape 368 may be divided into two fixing tapes and in this case, one of the two fixing tapes is provided in the upper side, the left side, and the right side of the flexible display device 300, and the other fixing tape is provided in the lower side of the flexible display device 300. However, the present disclosure is not limited thereto.

In addition, in the same manner as an exemplary aspect of the present disclosure described above, the flexible display device 300 according to another exemplary aspect of the present disclosure is characterized in that the adhesive layer 363 protrudes more than the polarizing plate and the display panel 310 at corners of the flexible display device 300, for waterproofing and sealing. And, the flexible display device 300 according to another exemplary aspect of the present disclosure is characterized in that, only at a lower corner region, a sealing material 390 is provided on side surfaces of the polarizing plate, the adhesive layer 363, the display panel 310, the first back plate 301a, the cushion tape 370, and the fixing tape 368.

That is, the fixing tape 368 may be attached to four sides of the flexible display device 300. In addition, in the corner region, the adhesive layer 363 may be configured to protrude more than the polarizing plate and the display panel 310. In this case, at an upper corner region, the sealing material 390 is not provided, due to the crossing of the fixing tape 368. On the other hand, the fixing tape 368 is not disposed at the lower corner region and thus, the sealing material 290 is additionally applied to the lower corner region. In this case, a portion of an upper surface and the side surface of the adhesive layer 363 protruding may be covered by the sealing material 390 and may not be exposed outwardly.

The sealing material 390 may be cured by ultraviolet light or heat.

The flexible display device 300 according to still another exemplary aspect of the present disclosure shows an example in which the protruding structure of the adhesive layer 363 is applied to all of four corners, in the same manner as an exemplary aspect of the present disclosure described above, but the present disclosure is not limited thereto.

Meanwhile, a micro-coating layer may be disposed on a bending area of the display panel 310. The micro-coating layer may be formed to cover one side of the barrier film.

A circuit element 361 may be connected to an end portion of the second flat portion of the display panel 310.

Various lines for transmitting signals to pixels disposed in a display area may be formed on the circuit element 361.

The circuit element 361 may be formed of a material having flexibility so that it is bendable.

A driver IC 365 may be mounted on the second flat portion of the display panel 310 and be connected to the lines formed on the circuit element 361 to thereby provide sub-pixels disposed in the display area with driving signals and data.

The circuit element 361 may be a flexible printed circuit board (FPCB).

One end of the circuit element 361 may be connected to the display panel 310 and the other end thereof may be bent and attached to the cushion tape 370.

Meanwhile, in the flexible display device according to the exemplary aspect of the present disclosure, the protruding structure of the adhesive layer may be used in all of the upper, lower, left, and right sides of the display device. In this case, a sealing material may be omitted from an upper corner. This will be described in detail through other aspects of the present disclosure.

Figure 14:
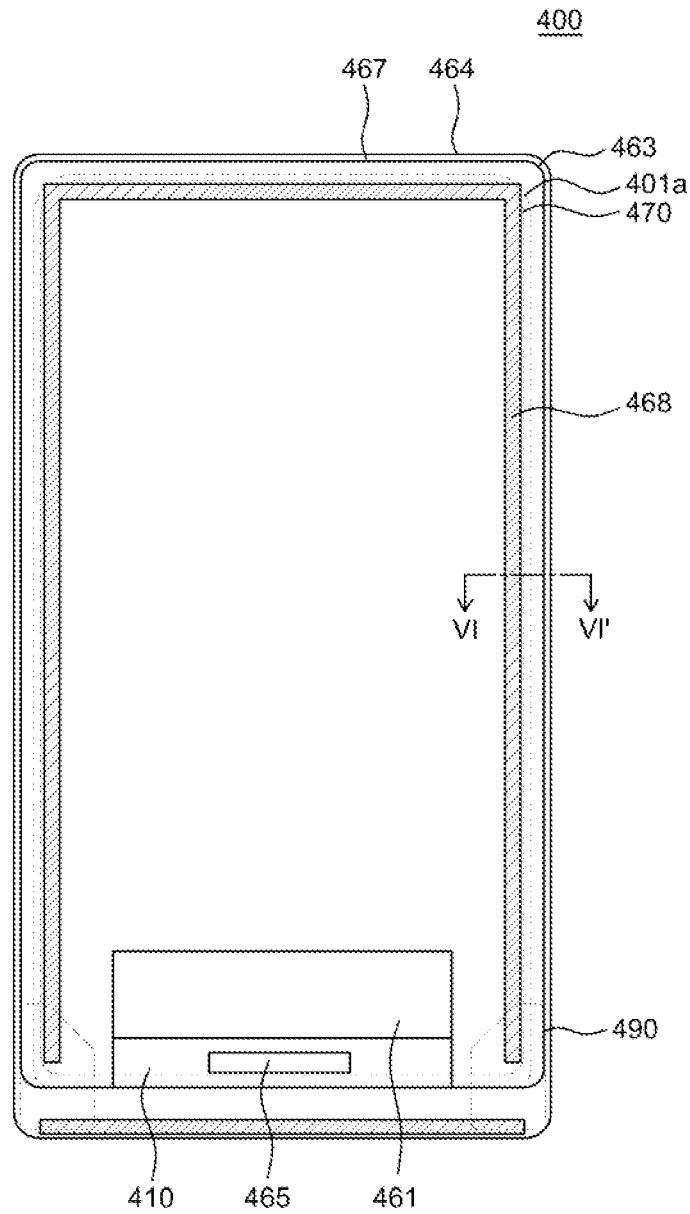
FIG. 14 is a rear view of a flexible display device according to still another exemplary aspect of the present disclosure.

FIG. 14 is a rear view of a flexible display device according to still another exemplary aspect of the present disclosure.

Figure 15:
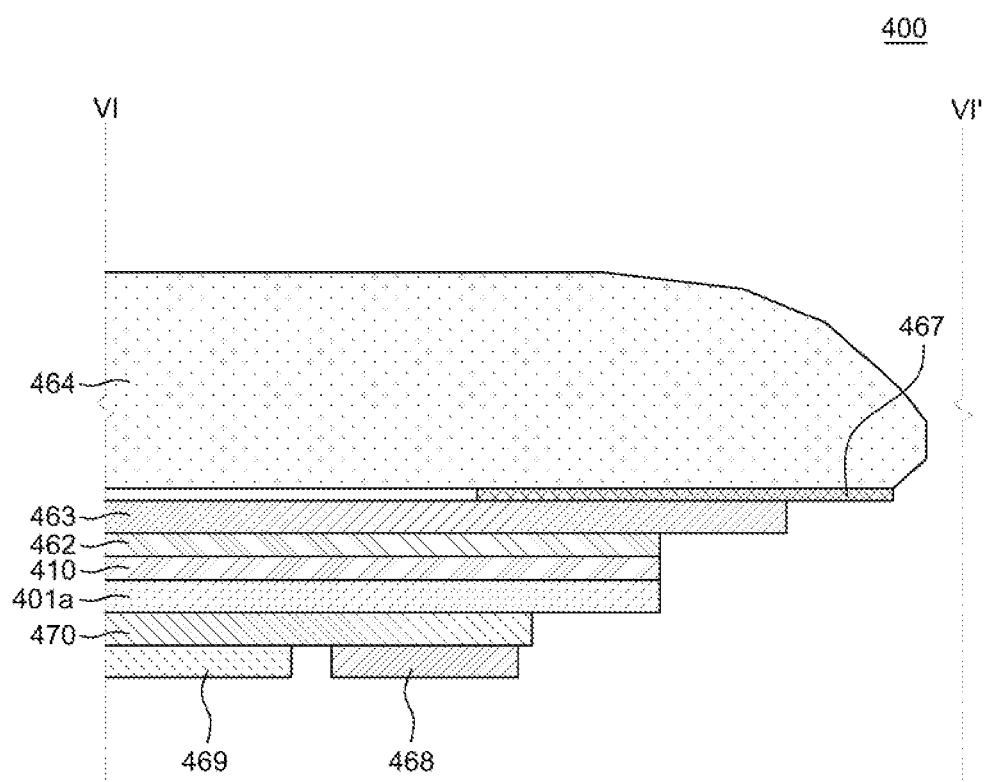
FIG. 15 is a cross-sectional view taken along line VI-VI' of FIG. 14.

FIG. 15 is a cross-sectional view taken along line VI-VI' of FIG. 14.

A flexible display device 400 of FIGS. 14 and 15 has substantially the same configuration as that of the flexible display device 300 according to still another exemplary aspect of the present disclosure, illustrated in FIG. 13, with the exception that a protruding structure of an adhesive layer 463 is applied in all of upper, lower, left and right sides of the display device 400.

FIGS. 14 and 15 provide illustrations with omission of a middle frame, for convenience.

With reference to FIGS. 14 and 15, the flexible display device 400 according to still another exemplary aspect of the present disclosure may include a display panel 410, a polarizing plate 462, and a cover glass 464.

A barrier film may be disposed on the display panel 410.

The polarizing plate 462 may be disposed on the barrier film.

The adhesive layer 463 may be disposed on the polarizing plate 462, whereby a cover glass 464 for protecting an exterior of the display device 400 may adhere to and disposed on the polarizing plate 462.

The adhesive layer 463 may include an optically clear adhesive (OCA).

A light blocking pattern 467 may be formed on four edges of the cover glass 464.

The flexible display device 400 according to another exemplary aspect of the present disclosure does not include a hole in an upper side thereof, so that a width of the light blocking pattern 467 disposed in the upper side may be formed to be relatively narrow as compared to an exemplary aspect of the present disclosure described above. However, it is not limited thereto.

The light blocking pattern 467 may be disposed on edges of a rear surface of the cover glass 464.

The light blocking pattern 467 may be formed to overlap a portion of the display panel 410, the adhesive layer 463, and the polarizing plate 462 that are disposed under the light blocking pattern 467.

The light blocking pattern 467 may be applied with black ink.

Although not shown, a touch screen panel may be further included on the display panel 410. In this case, the polarizing plate 462 may be positioned over the touch screen panel. When the touch screen panel is included, the cover glass 464 may be provided to cover at least a portion of the touch screen panel.

Back plates 401*a* may be disposed under the display panel 410.

The back plates 401*a* may be disposed adjacent to a bending area in other areas of the display panel 410 excluding the bending area.

The back plates 401*a* may include a first back plate 401*a* and a second back plate (not shown) positioned on a rear surface of the first flat portion and a rear surface of the second flat portion, respectively. The first back plate 401*a* reinforces rigidity of the first flat portion, so that the first flat portion may be maintained in a flat state. The second back plate reinforces rigidity of the second flat portion, so that the second flat portion may be maintained in a flat state. Meanwhile, to secure flexibility of the curved portion and facilitate a control of the neutral plane using the micro-coating layer, the back plates 401*a* may not be disposed on a rear surface of the curved portion.

A cushion tape 470 may be disposed on a rear surface of the first back plate 401*a* and between two back plates 401*a*.

The cushion tape 470 may be attached to the rear surface of the first back plate 401*a* using an adhesive.

A fixing tape 468 may be attached to three edges except a lower edge on a rear surface of the cushion tape 470 according to still another aspect of the present disclosure. The fixing tape 468 may be divided into two fixing tapes. That is, one of the two fixing tapes is provided in an upper side, a left side, and a right side of the flexible display device 400, and the other fixing tape is provided in a lower side of the flexible display device 400. However, the present disclosure is not limited thereto.

A conductive tape 469 for the ground may be disposed inside the fixing tape 468.

The conductive tape 469 may be attached to the rear surface of the cushion tape 470.

The flexible display device 400 according to still another exemplary aspect of the present disclosure is characterized in that the adhesive layer 463 protrudes more than the polarizing plate 462 and the display panel 410, in all of upper, lower, left and right sides of the flexible display device 400. Further, the flexible display device 400 according to another exemplary aspect of the present disclosure is characterized in that, only at a lower corner region, a sealing material 490 is provided on side surfaces of the polarizing plate 462, the adhesive layer 463, the display panel 410, the first back plate 401*a*, the cushion tape 470, and the fixing tape 468, in the same manner as the flexible display device 300 according to still another exemplary aspect of the present disclosure, described above.

The sealing material 490 may be cured by ultraviolet light or heat.

Meanwhile, a micro-coating layer may be disposed on a bending area of the display panel 410. The micro-coating layer may be formed to cover one side of the barrier film.

A circuit element 461 may be connected to an end portion of the second flat portion of the display panel 410.

Various lines for transmitting signals to pixels disposed in a display area may be formed on the circuit element 461.

The circuit element 461 may be formed of a material having flexibility so that it is bendable.

A driver IC 465 may be mounted on the second flat portion of the display panel 410 and be connected to the lines formed on the circuit element 461 to thereby provide sub-pixels disposed in the display area with driving signals and data.

The circuit element 461 may be a flexible printed circuit board (FPCB).

One end of the circuit element 461 may be connected to the display panel 410 and the other end thereof may be bent and attached to the cushion tape 470.

The exemplary aspects of the present disclosure can also be described as follows:

According to an aspect of the present disclosure, there is provided a flexible display device. The flexible display device includes a polarizing plate disposed on a display panel; a cover glass attached to the polarizing plate with an adhesive layer interposed therebetween; a back plate disposed on a rear surface of the display panel; and a fixing tape disposed on an edge of a rear surface of the cover glass, wherein the adhesive layer protrudes more than the display panel, the polarizing plate, and the back plate at corner regions of the flexible display device.

The display panel may include a display area and a bending area extending and bent from one side of the display area.

The flexible display device may further include circuit lines disposed on the display area and the bending area; and a micro-coating layer disposed on the circuit line in the bending area.

The adhesive layer may include an optically clear adhesive (OCA).

The flexible display device may further include a light blocking pattern provided on the edge of the rear surface of the cover glass.

The light blocking pattern may overlap a portion of the display panel, the adhesive layer, and the polarizing plate.

The flexible display device may further include a cushion tape disposed on a rear surface of the back plate.

The fixing tape may be attached to a rear surface of the light blocking pattern in an upper side and a lower side of the flexible display device, and may be attached to a rear surface of the cushion tape in a left side and a right side of the flexible display device.

The fixing tape may be attached to a rear surface of the cushion tape in an upper side of the flexible display device, and may be attached to a rear surface of the light blocking pattern in a lower side, a left side, and a right side of the flexible display device.

The fixing tape may be attached to a rear surface of the cushion tape in an upper side, a left side and a right side of the flexible display device, and may be attached to a rear surface of the light blocking pattern in a lower side of the flexible display device.

The fixing tape may be attached to a rear surface of the fixing tape in an upper side, a left side and a right side of the flexible display device, and may be attached to a rear surface of the light blocking pattern in a lower side of the flexible display device.

The flexible display device may further include a conductive tape disposed inside the fixing tape.

The flexible display device may further include a sealing material provided on side surfaces of the adhesive layer, the polarizing plate, the display panel, the back plate, the cushion tape, and the fixing tape.

The sealing material may cover a portion of the light blocking pattern.

The sealing material may be provided on the side surfaces of the adhesive layer, the polarizing plate, the display panel, the back plate, the cushion tape, and the fixing tape, only at a lower corner region of the corner regions.

The adhesive layer may protrude more than the display panel, the polarizing plate, and the back plate in all of upper, lower, left and right sides of the flexible display device.

According to another aspect of the present disclosure, there is provided a flexible display device. The flexible display device includes a polarizing plate disposed on a display panel; a cover glass attached to the polarizing plate with an adhesive layer interposed therebetween; a back plate disposed on a rear surface of the display panel; a cushion tape disposed on a rear surface of the back plate; a light blocking pattern provided on an edge of a rear surface of the cover glass; and a fixing tape attached to a rear surface of the light blocking pattern in an upper side and a lower side of the flexible display device, and attached to a rear surface of the cushion tape in a left side and a right side of the flexible display device, wherein the adhesive layer protrudes more than the display panel, the polarizing plate, and the back plate at corner regions of the flexible display device.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical concept of the present disclosure. The scope of the technical concept of the present disclosure is not limited thereto. Therefore, it should be understood that the above-described exemplary aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A flexible display device, comprising:
a polarizing plate disposed on a display panel;
an adhesive layer disposed on the polarizing plate;
a cover window having a curved edge and disposed on the polarizing plate;
a light blocking pattern disposed between the adhesive layer and the cover window;
a back plate disposed on a rear surface of the display panel;
a sealing material provided on side surfaces of the adhesive layer, the polarizing plate, the display panel and the back plate at corner regions and in contact with a lower surface of the light blocking pattern; and
a plurality of circuit lines disposed on the display area and extending to a bending area of the display panel,
wherein an outer edge of the curved edge of the cover window is positioned differently from outer edges of the light blocking pattern and the display panel.

2. The flexible display device of claim 1, wherein the display panel includes the display area and the bending area extended and bent from one side of the display area.

3. The flexible display device of claim 2, further comprising:
a micro-coating layer disposed on the plurality of circuit lines in the bending area.

4. The flexible display device of claim 1, wherein the adhesive layer includes an optically clear adhesive (OCA).

5. The flexible display device of claim 1, wherein the light blocking pattern is provided on an edge of a rear surface of the cover window.

6. The flexible display device of claim 5, wherein the light blocking pattern overlaps with a portion of the display panel, the adhesive layer and the polarizing plate.

7. The flexible display device of claim 5, further comprising a cushion tape disposed on a rear surface of the back plate.

8. The flexible display device of claim 7, further comprising a fixing tape extended along four edge sides of the flexible display device except for corner regions.

9. The flexible display device of claim 8, wherein the fixing tape is attached to a rear surface of the light blocking pattern in an upper side and a lower side of the flexible display device, and is attached to a rear surface of the cushion tape in a left side and a right side of the flexible display device.

10. The flexible display device of claim 8, wherein the fixing tape is attached to a rear surface of the cushion tape in an upper side of the flexible display device, and is attached to a rear surface of the light blocking pattern in a lower side, a left side, and a right side of the flexible display device.

11. The flexible display device of claim 8, wherein the fixing tape is attached to a rear surface of the cushion tape in an upper side, a left side and a right side of the flexible display device, and is attached to a rear surface of the light blocking pattern in a lower side of the flexible display device.

12. The flexible display device of claim 8, wherein the fixing tape is attached to a rear surface of the fixing tape in an upper side, a left side and a right side of the flexible display device, and is attached to a rear surface of the light blocking pattern in a lower side of the flexible display device.

13. The flexible display device of claim 9, further comprising a conductive tape disposed inside the fixing tape.

14. The flexible display device of claim 13, wherein the sealing material is also provided on side surfaces of the cushion tape, and the fixing tape.

15. The flexible display device of claim 14, wherein the sealing material covers a portion of the light blocking pattern.

16. The flexible display device of claim 14, wherein the sealing material is provided on the side surfaces of the adhesive layer, the polarizing plate, the display panel, the back plate, the cushion tape, and the fixing tape at a lower corner region of the corner regions only.

17. The flexible display device of claim 1, wherein the adhesive layer protrudes more than the display panel, the polarizing plate, and the back plate in upper, lower, left and right sides of the flexible display device.

18. A flexible display device comprising:
    a polarizing plate disposed on a display panel;
    an adhesive layer disposed on the polarizing plate;
    a cover window disposed on the polarizing plate,
    a light blocking pattern disposed between the adhesive layer and the cover window;
    a back plate disposed on a rear surface of the display panel;
    a plurality of circuit lines disposed on the display area and extending to a bending area of the display panel;
    a sealing material provided on side surfaces of the adhesive layer, the polarizing plate, the display panel and the back plate at corner regions and in contact with a lower surface of the light blocking pattern;
    and
    a cushion tape disposed on a rear surface of the back plate,
    wherein an outer edge of the cover window is positioned differently from outer edges of the light blocking pattern and the display panel.

19. The flexible display device of claim 18, further comprising a fixing tape attached to a rear surface of the light blocking pattern in an upper side and a lower side of the flexible display device, and attached to a rear surface of the cushion tape on a left side and a right side of the flexible display device.

20. The flexible display device of claim 19, further comprising a conductive tape disposed inside the fixing tape.

21. The flexible display device of claim 20, further comprising a sealing material provided on side surfaces of the adhesive layer, the polarizing plate, the display panel, the back plate, the cushion tape, and the fixing tape.

22. The flexible display device of claim 18, further comprising a light blocking pattern provided on an edge of a rear surface of the cover window.

\* \* \* \* \*